(12) United States Patent (10) Patent No.: US 11,094,277 B2
Zheng et al. (45) Date of Patent: Aug. 17, 2021

(54) SHIFT REGISTER AND DRIVING METHOD THEREOF, GATE DRIVE CIRCUIT AND DISPLAY APPARATUS

(71) Applicant: BOE TECHNOLOGY GROUP CO., LTD., Beijing (CN)

(72) Inventors: Haoliang Zheng, Beijing (CN); Seungwoo Han, Beijing (CN); Guangliang Shang, Beijing (CN); Xing Yao, Beijing (CN); Lijun Yuan, Beijing (CN); Zhichong Wang, Beijing (CN); Mingfu Han, Beijing (CN); Yinglong Huang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 151 days.

(21) Appl. No.: 16/149,432

(22) Filed: Oct. 2, 2018

(65) Prior Publication Data

US 2019/0108809 A1 Apr. 11, 2019

(30) Foreign Application Priority Data

Oct. 9, 2017 (CN) .......................... 201710932533.7

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G11C 19/28* (2013.01); *G11C 19/287* (2013.01);
(Continued)

(58) Field of Classification Search
None
See application file for complete search history.

(56) References Cited

U.S. PATENT DOCUMENTS 10,217,391 B2 2/2019 Shang et al.
10,269,282 B2 4/2019 Shan et al.
(Continued)

FOREIGN PATENT DOCUMENTS

CN 105702194 A 6/2016
CN 105869566 A 8/2016
(Continued)

OTHER PUBLICATIONS

Office Action dated Sep. 3, 2019 issued in corresponding Chinese Application No. 201710932533.7.

*Primary Examiner* — Tuan T Lam
(74) *Attorney, Agent, or Firm* — Nath, Goldberg & Meyer; Joshua B. Goldberg

(57) ABSTRACT

A shift register, a gate drive circuit, a display apparatus and a driving method of the shift register are provided. The shift register includes an input subcircuit, a first and a second output subcircuits, a trigger signal input terminal, a first and a second signal output terminals, a first and a second clock terminals and a pull-up node, a control terminal and an output terminal of the input subcircuit are electrically coupled to the trigger signal input terminal and the pull-up node, respectively, for providing a valid signal received by the control terminal of the input subcircuit to the pull-up node. The shift register is provided with the first and second output subcircuits which share the same input subcircuit, greatly reducing the number of devices and thus greatly simplifying the structure of the cascaded shift registers and reducing the area of the whole display apparatus.

15 Claims, 11 Drawing Sheets

(51) Int. Cl.
  *G11C 19/28* (2006.01)
  *G09G 3/20* (2006.01)
(52) U.S. Cl.
  CPC ............... *G09G 2310/0286* (2013.01); *G09G 2310/061* (2013.01); *G09G 2310/08* (2013.01)

(56) References Cited

U.S. PATENT DOCUMENTS

| | | | | |
|---|---|---|---|---|
| 2008/0266275 A1* | 10/2008 | Tsai | ............... | G09G 3/3677 345/204 |
| 2010/0259525 A1 | 10/2010 | Ohkawa et al. | | |
| 2011/0058642 A1* | 3/2011 | Tsai | ............... | G09G 3/3677 377/79 |
| 2012/0105338 A1* | 5/2012 | Lin | ............... | G06F 3/0416 345/173 |
| 2013/0033468 A1* | 2/2013 | Takahashi | ............... | G09G 3/20 345/204 |
| 2013/0100007 A1* | 4/2013 | Yamamoto | ............... | G09G 3/3677 345/100 |
| 2014/0093027 A1* | 4/2014 | Jang | ............... | G11C 5/005 377/64 |
| 2015/0002504 A1* | 1/2015 | Jo | ............... | G09G 3/3677 345/213 |
| 2015/0116194 A1* | 4/2015 | Matsui | ............... | G09G 3/3266 345/100 |
| 2016/0042693 A1* | 2/2016 | Cao | ............... | G09G 3/3258 345/212 |
| 2016/0247442 A1* | 8/2016 | Dai | ............... | G09G 3/3677 |
| 2017/0116911 A1* | 4/2017 | Shim | ............... | G09G 3/2092 |
| 2017/0270851 A1* | 9/2017 | Shang | ............... | G11C 19/28 |
| 2017/0330526 A1* | 11/2017 | Fan | ............... | G09G 3/3677 |
| 2018/0018920 A1* | 1/2018 | Kim | ............... | G09G 3/3266 |
| 2018/0204494 A1* | 7/2018 | Shang | ............... | G11C 19/28 |
| 2019/0006018 A1 | 1/2019 | Fang et al. | | |
| 2019/0066599 A1* | 2/2019 | Kim | ............... | G09G 3/3266 |
| 2019/0164498 A1* | 5/2019 | Jang | ............... | G09G 3/3266 |
| 2019/0189233 A1* | 6/2019 | Su | ............... | G11C 19/28 |
| 2019/0206294 A1* | 7/2019 | Tian | ............... | G09G 3/20 |

FOREIGN PATENT DOCUMENTS

| | | |
|---|---|---|
| CN | 106601175 A | 4/2017 |
| CN | 106782282 A | 5/2017 |

\* cited by examiner

SHIFT REGISTER AND DRIVING METHOD THEREOF, GATE DRIVE CIRCUIT AND DISPLAY APPARATUS

CROSS-REFERENCE TO RELATED APPLICATIONS

The present application claims the priority of the Chinese Patent Application No. 201710932533.7, filed on Oct. 9, 2017, the contents of which are incorporated herein in their entirety by reference.

TECHNICAL FIELD

The present disclosure relates to the field of display technology, and in particular, relates to a shift register and a driving method thereof, a gate drive circuit and a display apparatus.

BACKGROUND

A display screen based on thin film transistors (TFTs) is becoming a mainstream display apparatus for various notebook computers and desktop computers, and each pixel in the display screen is driven by a thin film transistor integrated behind the pixel and thus the display screen based on TFTs is a type of active matrix liquid crystal display apparatus.

SUMMARY

Embodiments of the present disclosure provide a shift register and a driving method thereof, a gate drive circuit and a display apparatus.

In one aspect, the shift register includes an input subcircuit, a first output subcircuit, a second output subcircuit, a trigger signal input terminal, a first signal output terminal, a second signal output terminal, a first clock terminal, a second clock terminal and a pull-up node; a control terminal and an output terminal of the input subcircuit are electrically coupled to the trigger signal input terminal and the pull-up node, respectively, for providing a valid signal received by the control terminal of the input subcircuit to the pull-up node; a control terminal, an input terminal and an output terminal of the first output subcircuit are electrically coupled to the pull-up node, the first clock terminal and the first signal output terminal, respectively, for providing a signal at the first clock terminal to the first signal output terminal under the control of the valid signal at the pull-up node; and a control terminal, an input terminal and the output terminal of the second output subcircuit are electrically coupled to the pull-up node, the second clock terminal and the second signal output terminal, respectively, for providing a signal at the second clock terminal to the second signal output terminal under the control of the valid signal at the pull-up node.

In an embodiment, the shift register further includes a first pull-down control subcircuit, a first output pull-down subcircuit, a second output pull-down subcircuit and a first pull-down node; a first control terminal, a first input terminal, a second input terminal and an output terminal of the first pull-down control subcircuit are electrically coupled to the pull-up node, a first level signal terminal, a second level signal terminal and the first pull-down node, respectively, for providing a valid signal at the second level signal terminal to the first pull-down node; a first control terminal, an input terminal and an output terminal of the first output pull-down subcircuit are electrically coupled to the first pull-down node, the third level signal terminal and the first signal output terminal, respectively, for providing a signal at the third level signal terminal to the first signal output terminal under the control of the valid signal at the first pull-down node; and a first control terminal, an input terminal and an output terminal of the second output pull-down subcircuit are electrically coupled to the first pull-down node, the third level signal terminal and the second signal output terminal, respectively, for providing a signal at the third level signal terminal to the second signal output terminal under the control of the valid signal at the first pull-down node.

In an embodiment, the first pull-down control subcircuit further comprises a second control terminal, which is electrically coupled to the trigger signal input terminal, and the first pull-down control subcircuit is configured to provide a signal at the first level signal terminal with the first pull-down node when a valid signal is received at the second control terminal.

In an embodiment, the shift register further includes a first pull-up node pull-down subcircuit, and a control terminal, an input terminal and an output terminal of the first pull-up node pull-down subcircuit are electrically coupled to the first pull-down node, the first level signal terminal and the pull-up node, respectively, for providing a signal at the first level signal terminal to the pull-up node under the control of a signal at the first pull-down node.

In an embodiment, the shift register further includes a second pull-down control subcircuit and a second pull-down node, and a first control terminal, a first input terminal, a second input terminal and an output terminal of the second pull-down control subcircuit are electrically coupled to the pull-up node, the first level signal terminal, a fourth level signal terminal and the second pull-down node, respectively, for providing a valid signal at the fourth level signal terminal to the second pull-down node.

In an embodiment, the second pull-down control subcircuit further comprises a second control terminal electrically coupled to the trigger signal input terminal, and the second pull-down control subcircuit is configured to provide a signal at the first level signal terminal to the second pull-down node when a valid signal is received by the second control terminal of the second pull-down control subcircuit.

In an embodiment, the shift register further includes a second pull-up node pull-down subcircuit, and a control terminal, an input terminal and an output terminal of the second pull-up node pull-down subcircuit are electrically coupled to the second pull-down node, the first level signal terminal and the pull-up node, respectively, for providing a signal at the first level signal terminal to the pull-up node under the control of a signal at the second pull-down node.

In an embodiment, the shift register further includes a first reset subcircuit and a first reset terminal, and a control terminal, an input terminal and an output terminal of the first reset subcircuit are electrically coupled to the first reset terminal, the first level signal terminal and the pull-up node, respectively, for providing a signal at the first level signal terminal to the pull-up node under the control of a valid signal at the first reset terminal.

In an embodiment, the shift register further includes an output register subcircuit, a shift clock terminal and a shift signal output terminal, and a control terminal, an input terminal and an output terminal of the output register subcircuit are electrically coupled to the pull-up node, the shift clock terminal and the shift signal output terminal, respectively, for providing a signal at the shift clock terminal to the shift signal output terminal under the control of the valid signal at the pull-up node.

In an embodiment, the shift register further includes a register pull-down subcircuit, and a first control terminal, a second control terminal, an input terminal and an output terminal of the register pull-down subcircuit are electrically coupled to the first pull-down node, the second pull-down node, the first level signal terminal and the shift signal output terminal, respectively, for providing a signal at the first level signal terminal to the shift signal output terminal under the control of a valid signal at the first pull-down node or the second pull-down node.

In an embodiment, the shift register further includes a third output subcircuit to a $K^{th}$ output subcircuit, a third clock terminal to a $K^{th}$ clock terminal, a third signal output terminal to a $K^{th}$ signal output terminal, and a third output pull-down subcircuit to a $K^{th}$ output pull-down subcircuit; K is a natural number greater than or equal to 3, all the third output subcircuit to the $K^{th}$ output subcircuit are electrically coupled to the pull-up node, and all the third output pull-down subcircuit to the $K^{th}$ output pull-down subcircuit are electrically coupled to both the first pull-down node and the second pull-down node.

In an embodiment, the first pull-down control subcircuit comprises a fourth transistor, a fifth transistor, a sixth transistor, a seventh transistor and a ninth transistor; a gate of the sixth transistor as the first control terminal of the first pull-down control subcircuit is electrically coupled to the pull-up node; a gate of the seventh transistor as the second control terminal of the first pull-down control subcircuit is electrically coupled to the trigger signal input terminal; first electrodes of the fourth transistor, the sixth transistor, and the seventh transistor as the first input terminal of the first pull-down control subcircuit are all electrically coupled to the first level signal terminal, and second electrodes of the sixth transistor and the seventh transistor are electrically coupled to the first pull-down node; and a second electrode of the fourth transistor, a gate of the fifth transistor and a first electrode of the ninth transistor are electrically coupled to each other; a second electrode of the fifth transistor and a second electrode of the ninth transistor as the second input terminal of the first pull-down control subcircuit are electrically coupled to each other; a first electrode of the fifth transistor is electrically coupled to the first pull-down node; and a gate and a first electrode of the fourth transistor are electrically coupled to the pull-up node and the first level signal terminal, respectively.

In an embodiment, the first output pull-down subcircuit comprises a thirteenth transistor and a fourteenth transistor; a gate, a first electrode and a second electrode of the thirteenth transistor are electrically coupled to the first pull-down node, the third level signal terminal and the first signal output terminal, respectively; and a gate, a first electrode and a second electrode of the fourteenth transistor are electrically coupled to the second pull-down node, the third level signal terminal and the first signal output terminal, respectively.

In an embodiment, the second pull-down control subcircuit comprises a fortieth transistor, a fiftieth transistor, a sixtieth transistor, a seventieth transistor and a ninetieth transistor; a gate of the sixtieth transistor as the first control terminal of the second pull-down control subcircuit is electrically coupled to the pull-up node; a gate of the seventieth transistor as the second control terminal of the second pull-down control subcircuit is electrically coupled to the trigger signal input terminal; first electrodes of the fortieth transistor, the sixtieth transistor, and the seventieth transistor each as the first input terminal of the second pull-down control subcircuit is electrically coupled to the first level signal terminal; and both second electrodes of the sixtieth transistor and the seventieth transistors are electrically coupled to the second pull-down node; and a second electrode of the fortieth transistor, a gate of the fiftieth transistor and a first electrode of the ninetieth transistor are electrically coupled to each other; a second electrode of the fiftieth transistor and a second electrode of the ninetieth transistor each as the second input terminal of the second pull-down control subcircuit are electrically coupled to each other; a first electrode of the fiftieth transistor is electrically coupled to the second pull-down node; and a gate the fortieth transistor is electrically coupled to the pull-up node.

In another aspect, the gate drive circuit includes N shift registers each of which is the above shift register, an input terminal of the $n^{th}$ shift register is coupled to a shift signal output terminal of the $(n-1)^{th}$ shift register, and a first reset terminal of the $n^{th}$ shift register is coupled to the shift signal output terminal of the $(n+2)^{th}$ shift register; where n is a natural number greater than 1, and N is greater than 1, and $N-2 \geq n > 2$.

In an embodiment, the display apparatus includes the above gate drive circuit for controlling pixels included in the display apparatus.

In another aspect, the driving method of the above shift register includes steps of: providing, by the input subcircuit, a valid signal received by the control terminal of the input subcircuit from the trigger signal input terminal to the pull-up node; providing, by the first output subcircuit, a signal at the first clock terminal electrically coupled to the first output subcircuit to the first signal output terminal when the valid signal at the pull-up node is received by the control terminal of the first output subcircuit; and providing, by the second output subcircuit, a signal at the second clock terminal electrically coupled to the second output subcircuit to the second signal output terminal when the valid signal at the pull-up node is received by the control terminal of the second output subcircuit.

In an embodiment, the driving method further includes a step of providing, by the first pull-down control subcircuit and the second pull-down control subcircuit, valid signals to the first pull-down node and the second pull-down node, respectively, when the valid signals are alternately output at the second level signal terminal and the fourth level signal terminal, such that the first output pull-down subcircuit provides a signal at the third level signal terminal to the first signal output terminal under the control of the valid signal at the first pull-down node or the second pull-down node, and the second output pull-down subcircuit provides a signal at the third level signal terminal to the second signal output terminal under the control of the valid signal at the first pull-down node or the second pull-down node.

In an embodiment, the driving method further includes a step of providing, by the first clock terminal and the second clock terminal, a first pulse signal and a second pulse signal with synchronous rising edges to the input terminal of the first output subcircuit and the input terminal of the second output subcircuit when valid signals are received by the control terminal of the first output subcircuit and the control terminal of the second output subcircuit.

In an embodiment, a falling edge of the second pulse signal is delayed relative to a falling edge of the first pulse signal by a phase delay.

BRIEF DESCRIPTION OF THE DRAWINGS

The above and/or other aspects and advantages of the present disclosure will be obvious and easily understood from the following descriptions of the embodiments made in conjunction with the accompanying drawings.

DETAILED DESCRIPTION

As the resolution of an LCD panel gets higher and higher, PPI (Pixels Per Inch, the number of pixels per inch) gets higher and higher. Generally, a gate drive circuit is composed of a plurality of shift registers, connection between which in the gate drive circuit is complex, and an area of the whole gate drive circuit is large, thus occupying a larger area of the LCD panel. Therefore, it is not advantageous for the LCD panel to become miniaturized and be realized with low cost. With the development of flat panel display apparatus, narrow frame, thinning down and low cost have become the development trend of flat panel display apparatus. Especially for a small size and high resolution product, it has become an urgent technical problem to be solved to develop a simplified structure of a gate drive circuit and reduce the area of the gate drive circuit.

In the flat panel display apparatus, a plurality of pixels are turned on row by row and perform display in turn based on data of an input image to realize display of an image frame. The pixels are usually turned on by a gate drive circuit, which includes a plurality of cascaded shift registers. The shift register turns on the corresponding pixels (such as all pixels in a same row) under the control of a clock signal, and the turned-on pixels receive the image signals including RGB information in sequence, and perform the image display. RGB colors are the known three primary colors, R for Red (red), G for Green (green), B for Blue (blue).

The inventors of the present disclosure have found that with the development of display technology, a gate drive circuit has evolved into GOA (Gate Driver On Array) technology. That is, the gate drive circuit is integrated in an array substrate. This technology further reduces the width of the frame of the display apparatus and reduces the production cost. The clock signal lines of multiple GOA units usually circulate in turn.

The inventors of the present disclosure have found that in order to reduce cost at a high resolution, an effective solution is to reduce the number of data integration circuits (or data ICs), and thus the display apparatus may be driven by using 2G1D (2Gate 1Data) or 3G1D (3Gate 1Data). 2G1D indicates that one data line is coupled to TFTs in two columns of sub-pixels, and 3G1D indicates that one date line is coupled to TFTs in three rows of sub-pixels. However, the problem with 3G1D is that GOA's layout is more difficult, and the border thereof is more than three times larger than that of 1G1D.

Figure 1:
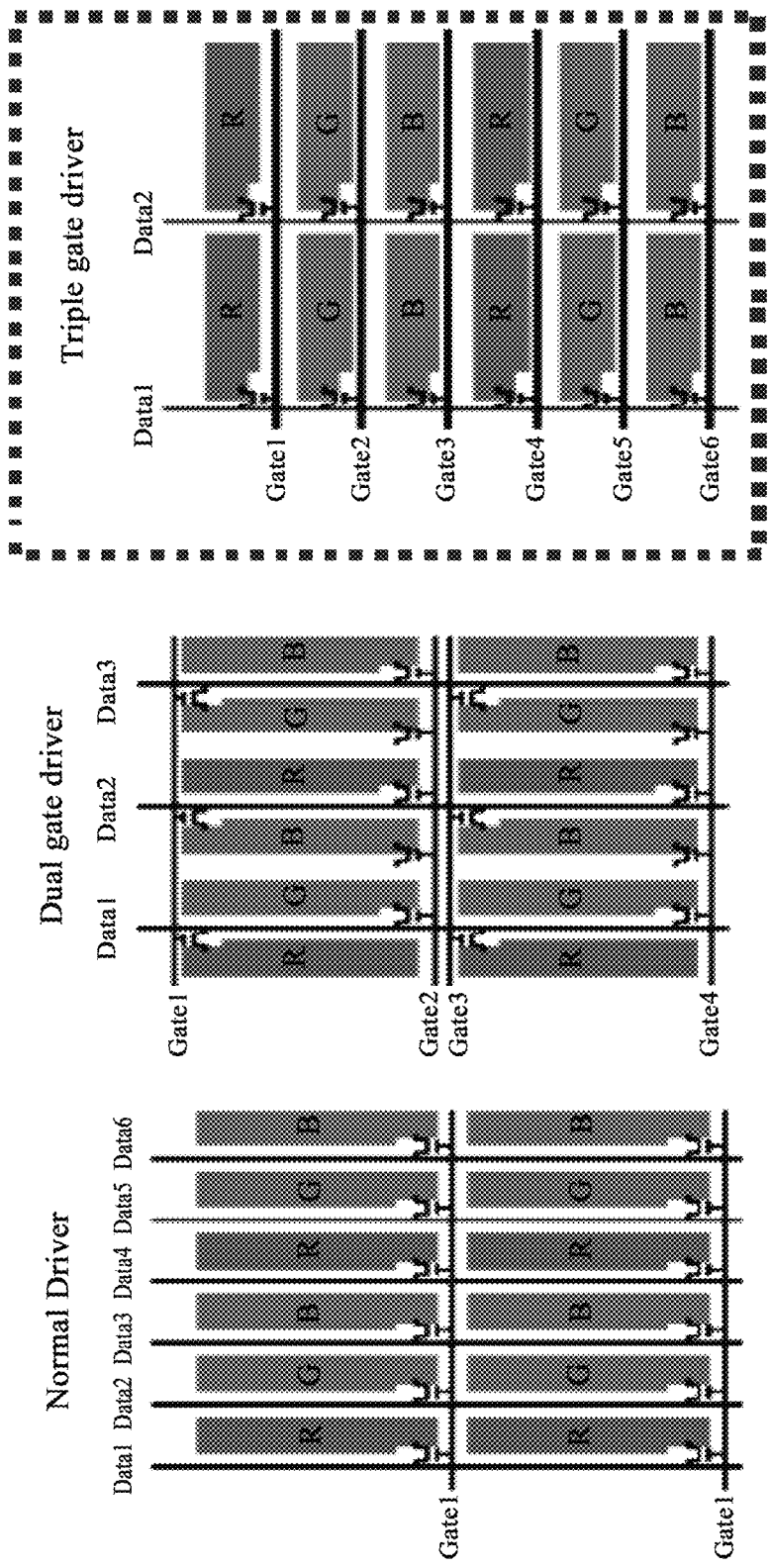
FIG. 1 is a schematic view illustrating driving principles of three types of gate drive circuits according to an embodiment of the present disclosure.

FIG. 1 shows three types of gate drive circuits for driving TFTs in different numbers of sub-pixels coupled to one data line. As shown in FIG. 1, the left-hand part of FIG. 1 shows the arrangement of 1G1D (1Gate 1Data) which is usually used, Normal Driver, where a data line corresponds to TFTs in a column of sub-pixels. The middle part of FIG. 1 shows an arrangement of 2G1D, Dual-gate driver, where one data line corresponds to TFTs in two columns of sub-pixels. The right-hand part of FIG. 1 shows an arrangement of 3G1D, Triple-gate driver, where one date line is coupled to TFTs in three row sub-pixels of RGB.

In order to reduce the cost of a display apparatus, the inventors tried to design a gate drive circuit based on the Dual-gate driver or the Triple-gate driver. However, due to the high resolution requirements, the inventor has found that more shift registers are required for the conventional Triple-gate driver, thus occupying more area and needing a wider border. The present disclosure provides a shift register which can narrows down the border.

Embodiments of the present disclosure are described in detail below, examples thereof are illustrated in the drawings throughout which identical or similar reference signs denote identical or similar elements or elements having the same or similar functions. The following embodiments described with reference to the accompanying drawings are illustrative and are intended only to describe the present disclosure and not be construed as limitations thereof.

In order to solve the problem of an excessively large border due to the existing multi-gate driver, an embodiment of the present disclosure provides a shift register. Two or more output subcircuits in the shift register share a PU (pull-up) node, and/or a PD (pull-down) node to reduce the border and achieve a narrow-frame design.

Figure 2A:
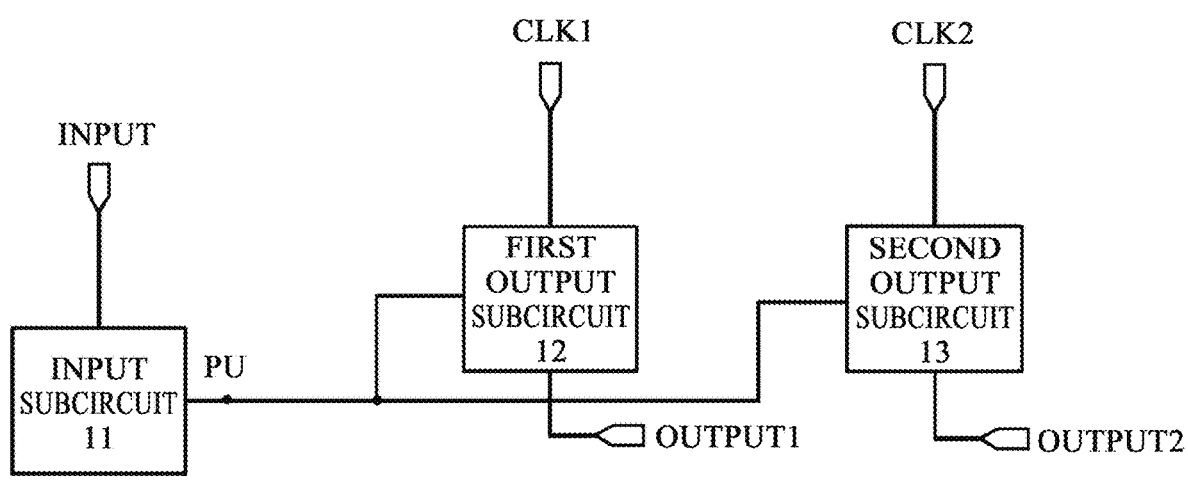
FIG. 2A is a schematic view illustrating a structure of a shift register according to an embodiment of the present disclosure.

An embodiment of the present disclosure provides a shift register in one aspect. FIG. 2A is a schematic view of a structure of the shift register according to the embodiment of the present disclosure. Referring to FIG. 2A, the shift register includes: an input subcircuit 11, a first output subcircuit 12, a second output subcircuit 13, a trigger signal input terminal INPUT, a first signal output terminal Output1 (also known as OUT1), a second signal output terminal Output2 (also known as OUT2), and a clock terminal CLK. The shift register further includes a pull-up node PU.

A control terminal of the input subcircuit 11 is electrically coupled to the trigger signal input terminal INPUT, and an output terminal of the input subcircuit 11 is electrically coupled to the pull-up node PU for providing a valid signal to the pull-up node PU when the valid signal is received by the control terminal of the input subcircuit 11.

An control terminal, an input terminal and an output terminal of the first output subcircuit 12 are electrically coupled to the pull-up node PU, the clock terminal CLK and the first signal output terminal Output1, respectively, for conducting the clock terminal CLK with the first signal output terminal Output1 under the control of a valid signal of the pull-up node PU.

An control terminal, an input terminal and an output terminal of the second output subcircuit 13 are electrically coupled to the pull-up node PU, the clock terminal CLK and the second signal output terminal Output2, respectively, for conducting the clock terminal CLK with the second signal output terminal Output2 under the control of a valid signal of the pull-up node PU.

The shift register provided by the embodiment of the present disclosure is configured with the first output subcircuit 12 and the second output subcircuit 13, and the first output subcircuit 12 and the second output subcircuit 13 share a same input subcircuit and the PU node, which greatly reduces the number of circuit devices compared with the existing configuration in which one input subcircuit is provided for each output subcircuit, greatly simplifies the circuit structure of cascaded shift registers and reduces the overall circuit area. It solves the technical problems that a gate drive circuit with a shift register as a unit occupies a larger area of an array substrate and has a wider border, and thus provides a technical support for the development of a display panel to be miniaturized and realized with low cost.

Figure 2B:
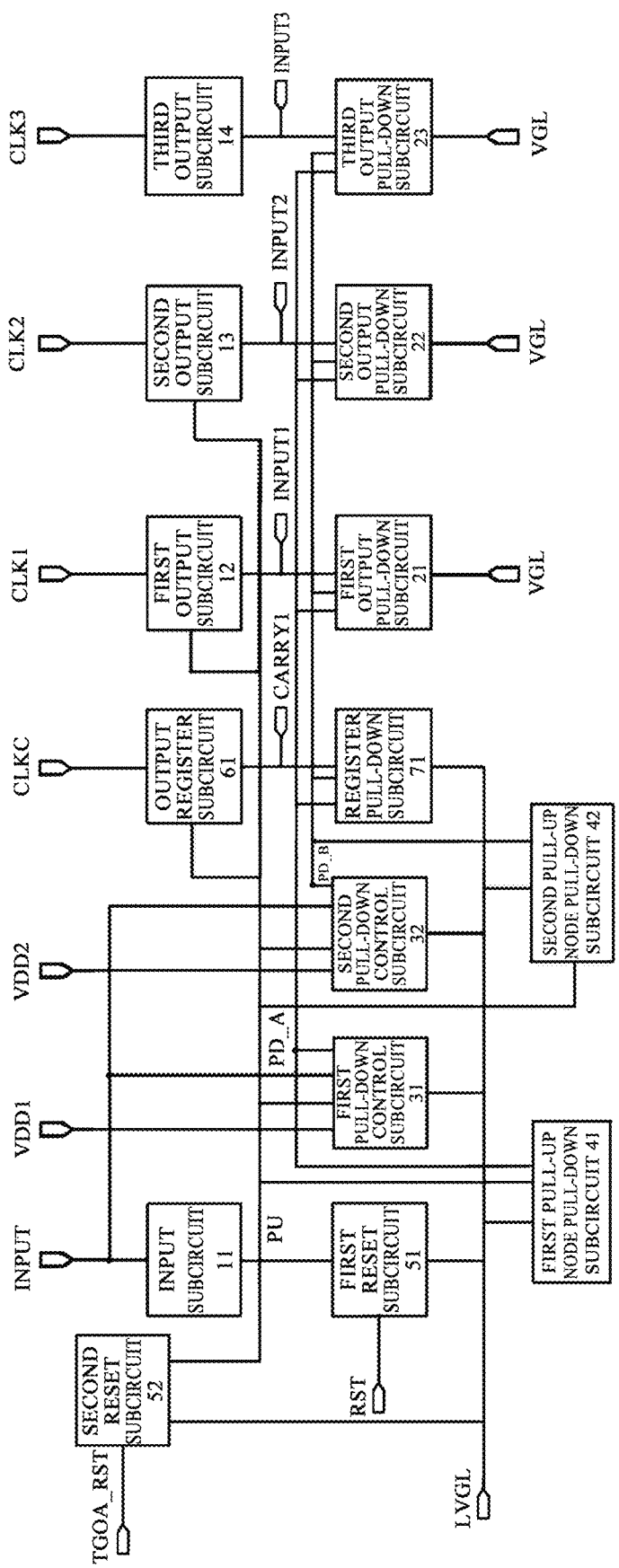
FIG. 2B is a schematic view illustrating a structure of a shift register according to an embodiment of the present disclosure.

FIG. 2B is a schematic view of a structure of a shift register according to an embodiment of the present disclosure. As shown in FIG. 2B, the shift register further includes a first pull-down control subcircuit 31, a first output pull-down subcircuit 21, a second output pull-down subcircuit 22, a first pull-down node PD_A and a second pull-down node PD_B.

As for the first pull-down control subcircuit 31, a first control terminal is electrically coupled to the pull-up node PU, a first input terminal is electrically coupled to a first level signal terminal LVGL, a second input terminal is electrically coupled to a second level signal terminal VDD1, and an output terminal is electrically coupled to the first pull-up node PD_A. With this configuration, the first pull-down control subcircuit 31 is used to provide a valid signal to the first pull-down node PD_A based on the valid signal at the second level signal terminal VDD1.

A first control terminal, a second control terminal, an input terminal and an output terminal of the first output pull-down subcircuit 21 are electrically coupled to the first pull-down node PD_A, the second pull-down node PD_B, a third level signal terminal VGL, and the first signal output terminal Output1, respectively, for conducting the third level signal terminal VGL with the first signal output terminal Output1 under the control of a valid signal at the first pull-down node PD_A or the second pull-down node PD_B.

A first control terminal, a second control terminal, an input terminal and an output terminal of the second output pull-down subcircuit 22 are electrically coupled to the first pull-down node PD_A, the second pull-down node PD_B, the third level signal terminal VGL, and the second signal output terminal Output2, respectively, for conducting the third level signal terminal VGL with the second signal output terminal Output2 under the control of the valid signal at the first pull-down node PD_A or the second pull-down node PD_B.

In the shift register according to the embodiment of the present disclosure, the first pull-down control subcircuit 31 provides a valid signal to the first pull-down node PD_A based on the valid signal at the second level signal terminal VDD1, such that the first output pull-down subcircuit 21 and the second output pull-down subcircuit 22 make the first signal output terminal Output1 and the second signal output terminal Output2 conduct with the third level signal terminal VGL, respectively, and the first signal output terminal Output1 and the second signal output terminal Output2 are clamped at a third level at the third level signal terminal VGL. When the third level signal is an invalid level (e.g. low level) signal, the first signal output terminal Output1 and the second signal output terminal Output 2 are clamped at the invalid level signal, thus preventing the first signal output terminal Output 1 and the second signal output terminal Output 2 of the shift register from outputting noise signals in a pull-down stage, and preventing interference with other circuits such as other shift registers. Furthermore, the first output subcircuit 12 and the second output subcircuit 13 share the same first pull-down control subcircuit 31, which reduces the number of circuit devices, simplifies the circuit structure of the cascaded shift registers, and reduces the overall circuit area, compared with the existing configuration in which one first pull-down control subcircuit 31 is provided for each output subcircuit.

In an embodiment, the second control terminal of the first pull-down control subcircuit 31 is electrically coupled to the trigger signal input terminal INPUT, for conducting the first level signal terminal LVGL with the first pull-down node PD_A when a valid signal is received at the second control terminal. The trigger signal input terminal INPUT is coupled to the second control terminal of the first pull-down control subcircuit 31 such that a level at the first pull-up node PD_A is pulled down during an input stage by the first pull-down control subcircuit 31 under the control of the second control terminal, preventing a level at the pull-up node PU from being reduced and preventing output from being affected in the prior art in which the level at the first pull-down node PD_A is only pulled down by the pull-up node PU. In the embodiment of the present disclosure, the second control terminal of the first pull-down control subcircuit 31 shares the control load of the pull-up node PU, preventing the level at the pull-up node PU from being reduced. The first pull-down control subcircuit 31 of the embodiment clamps the level at the pull-up node PU based on a first level signal at the first level signal terminal LVGL to prevent the first and second output subcircuits 12, 13 from outputting noise signals during the pull-down stage.

As shown in FIG. 2B, the shift register further includes a first pull-up node pull-down subcircuit 41. A control terminal, an input terminal and an output terminal of the first pull-up node pull-down subcircuit 41 are electrically coupled to the first pull-down node PD_A, the first level signal terminal LVGL and the pull-up node PU, respectively, for conducting the first level signal terminal LVGL with the pull-up node PU during the pull-down stage. The first pull-up node pull-down subcircuit 41 is used to pull a level of the pull-up node PU to the first level at the first level signal terminal LVGL during the pull-down stage (when the first level is invalid, a level of the pull-up node PU is pulled down to the invalid level), such that when each output subcircuit receives an invalid level at its control terminal, the output subcircuit is turned off, and the output signal of the output subcircuit is changed to be at an invalid level, which prevents the output subcircuit from outputting noise signals and interfering with other circuits.

As shown in FIG. 2B, the shift register further includes a second pull-down control subcircuit 32.

A control terminal, a first input terminal, a second input terminal and an output terminal of the second pull-down control subcircuit 32 are electrically coupled to the pull-up node PU, the first level signal terminal LVGL, a fourth level signal terminal VDD2, and the second pull-down node PD_B, respectively, for providing a valid signal to the second pull-down node PD_B based on the valid signal at the fourth level signal terminal VDD2.

The second pull-down control subcircuit 32 in the embodiment provides a valid signal to the second pull-down node PD_B based on the valid signal at the fourth level signal terminal VDD2, and controls the first and second output pull-down subcircuits 21, 22 to clamp the first and second signal output outputs Output1 and Output2 at the third level. The second pull-down control subcircuit 32 together with the first pull-down control subcircuit 31 make an alternate control on the first and second output pull-down subcircuits 21 and 22, to clamp the first and second signal output terminals Output 1 and Output 2 at the third level. The second pull-down control subcircuit 32 shares the control load of the first pull-down control subcircuit 31 and prolongs the service life of the first pull-down control subcircuit 31 and the second pull-down control subcircuit 32.

As shown in FIG. 2B, the shift register further includes a first reset subcircuit 51 and a first reset terminal RST.

A control terminal, an input terminal and an output terminal of the first reset subcircuit 51 are electrically coupled to the first reset terminal RST, the first level signal terminal LVGL and the pull-up node PU, respectively, for conducting the first level signal terminal LVGL with the pull-up node PU under the control of a valid signal at the first reset terminal RST The first output subcircuit 12 and the second output subcircuit 13 of the present disclosure share the same first reset subcircuit 51, which reduces the number of circuit devices, simplifies the circuit structure of the cascaded shift registers, and reduces the overall circuit area compared with the prior art in which each output subcircuit is provided with a separate reset subcircuit.

In one embodiment, the shift register further includes a second reset terminal TGOA_RST and a second reset subcircuit 52.

A control terminal of the second reset subcircuit 52 is electrically coupled to the second reset terminal TGOA_RST for conducting the first level signal terminal LVGL with the pull-up node PU under the control of a valid signal at the second reset terminal TGOA_RST. When all GOAs in the whole gate drive circuit are reset once again at the end of an image frame, the second reset subcircuit 52 of the present disclosure is used to zero (or clear) signal output terminals of all the GOAs according to an overall reset signal at the second reset terminal TGOA_RST.

Figure 3:
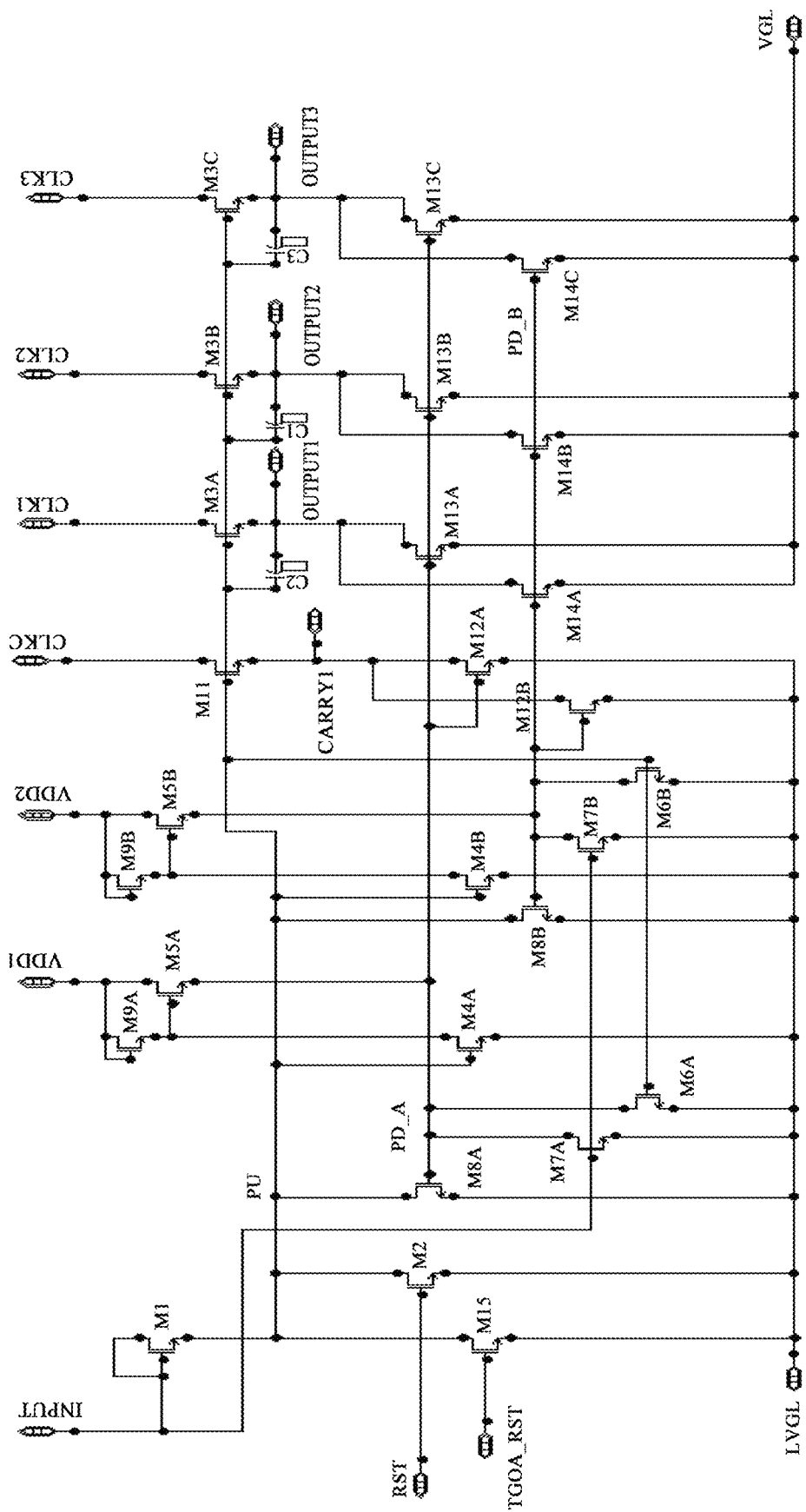
FIG. 3 is a schematic view illustrating a circuit diagram of a shift register according to an embodiment of the present disclosure.

As shown in FIG. 2B, the shift register further includes an output register subcircuit 61, a shift clock terminal (CLKC in CLK) and a shift signal output terminal Carry1 (also known as CARRY1). It should be understood that, the clock terminal CLK may include clock terminals CLKC, CLK1, CLK2, CLK3, . . . , as shown in FIG. 3. Thus, these clock terminals may be collectively referred to as the clock terminal CLK in a case where there is no need to be distinguished from each other.

A control terminal, an input terminal and an output terminal of the output register subcircuit 61 are electrically coupled to the pull-up node PU, the shift clock terminal CLK and the shift signal output terminal Carry1, respectively, for conducting the shift clock terminal CLK with the shift signal output terminal Carry1 under the control of a valid signal at the pull-up node PU. When waveforms and phases of signals at the shift clock terminal CLK and a clock terminal of an output subcircuit are identical, a shift signal output by the output register subcircuit 61 has the same waveform and phase as the output signal output by the output subcircuit, the shift signal in the present disclosure is output as a trigger input signal of another designated shift register and the output signal may be used as a driving signal for driving a TFT so that the trigger input signal is provided to be separated from the driving signal. Compared with the conventional case in which the output signal is also used as the trigger input signal, the output load of the output subcircuit is reduced and the interference between the trigger signal and the driving signal is reduced. The stability of the driving signal is improved and the service life of the output mode is prolonged.

As shown in FIG. 2B, the shift register further includes a register pull-down subcircuit 71.

A first control terminal, a second control terminal, an input terminal and an output terminal of the register pull-down subcircuit 71 are electrically coupled to the first pull-down node PD_A, the second pull-down node PD_B, the first level signal terminal LVGL, and the shift signal output terminal Carry1, respectively, for conducting the first level signal terminal LVGL with the shift signal output terminal Carry1 under the control of a valid signal at the first pull-down node PD_A or the second pull-down node PD_B. The register pull-down subcircuit 71 of the present disclosure clamps a signal output by the shift signal output terminal Carry1 at the first level under the control of the valid signal at the first pull-down node PD_A or the second pull-down node PD_B, to reduce interference to a back-end circuit of the shift signal output terminal Carry1.

In an embodiment, the shift register of the present disclosure further includes a third output subcircuit 14, a third clock terminal CLK3, a third signal output terminal Output 3 and a third output pull-down subcircuit 23; and so on, up to a Kth output subcircuit, a Kth clock terminal, a Kth signal output terminal and a Kth output pull-down subcircuit, where K is a natural number greater than or equal to 3.

Similar to the first output subcircuit 12 and the second output subcircuit 13, the third output subcircuit 14 to the Kth output subcircuit are electrically coupled to the pull-up node PU; the third output pull-down subcircuit 23 to the Kth output pull-down subcircuit are electrically coupled to the first pull-down node PD_A and the second pull-down node PD_B.

FIG. 3 is a schematic view of a circuit structure of a shift register according to an embodiment of the present disclosure, and shows various devices for configuring the various subcircuits shown in FIGS. 2A and 2B.

An input subcircuit 11 includes a first transistor M1; a first reset subcircuit 51 includes a second transistor M2; a second reset subcircuit 52 includes a fifteenth transistor M15; a first pull-down control subcircuit 31 includes a fourth transistor M4A, a fifth transistor M5A, a sixth transistor M6A, a seventh transistor M7A and a ninth transistor M9A; a second pull-down control subcircuit 32 includes a fortieth transistor M4B, a fiftieth transistor M5B, a sixtieth transistor M6B, a seventieth transistor M7B and a ninetieth transistor M9B; an output register subcircuit 61 includes an eleventh transistor M11; a register pull-down subcircuit 71 includes a twelfth transistor M12A and a twenty-second M12B; and a first output subcircuit 12 includes a third transistor M3A; a second output subcircuit 13 includes a thirtieth transistor M3B; a third output subcircuit 14 includes a thirty-first transistor M3C; a first output pull-down subcircuit 21 includes a thirteenth transistor M13A and a fourteenth transistor M14A; a second output pull-down subcircuit 22 includes a twenty-third transistor M13B and a twenty-fourth transistor M14B; a third output pull-down subcircuit 23 includes a thirty-third transistor M13C and a thirty-fourth transistor M14C; a first pull-up node pull-down subcircuit 41 includes a eighth transistor M8A; and a second pull-up node pull-down subcircuit 42 includes a eighteenth transistor M8B.

As shown in FIG. 3, a substantially identical coupling capacitor is coupled between a gate and a source of each of the third transistor M3A, the thirtieth transistor M3B, and the thirty-first transistor M3C. The coupling capacitor is provided to pull up the level of the signal at the node which is connected to two terminals of the coupling capacitor.

The shift register further includes a trigger signal input terminal INPUT, a first signal output terminal OUT1, a second signal output terminal OUT2, a first clock terminal CLK1, and a second clock terminal CLK2. The shift register further includes a pull-up node PU.

A first electrode (drain) of the first transistor M1 is electrically coupled to the trigger signal input terminal INPUT, and a second electrode (source) of the first transistor M1 is electrically coupled to the pull-up node PU for providing a valid signal to the pull-up node PU when the valid signal is received at a control terminal of the first transistor M1.

A gate of the third transistor M3A is electrically coupled to the pull-up node PU, a drain of the third transistor M3A is electrically coupled to the first clock terminal CLK1, and a source of the third transistor M3A is electrically coupled to the first signal output terminal OUT1 for conducting the first clock terminal CLK1 with the first signal output terminal OUT1 under the control of a valid signal at the pull-up node PU.

A gate of the thirtieth transistor M3B is electrically coupled to the pull-up node PU, a drain of the thirtieth transistor M3B is electrically coupled to the second clock terminal CLK2, and a source of the thirtieth transistor M3B is electrically coupled to the second signal output terminal OUT2 for conducting the second clock terminal CLK2 with the second signal output terminal OUT2 under the control of a valid signal at the pull-up node PU.

The shift register further includes a first pull-down node PD_A.

In the first pull-down control subcircuit 31, a gate of the sixth transistor M6A is electrically coupled to the pull-up node PU, and a first electrode (source) of the sixth transistor M6A is electrically coupled to the first level signal terminal LVGL. A second electrode (drain) of the fifth transistor M5A is electrically coupled to the second level signal terminal VDD1. The second electrode (drain) of the sixth transistor M6 A is electrically coupled to the first pull-down node PD_A to provide a valid signal to the first pull-down node PD_A based on the valid signal at the second level signal terminal VDD1. The first pull-down control subcircuit 31 clamps a level of the pull-up node PU based on a first level at the first level signal terminal LVGL during the pull-down phase to prevent the first and second output subcircuits 12 and 13 from outputting noise signals during the pull-down stage.

A gate of the thirteenth transistor M13A in the first output pull-down subcircuit 21 is electrically coupled to the first pull-down node PD_A. A source of the thirteenth transistor M13A is electrically coupled to the third level signal terminal VGL. A drain of the thirteenth transistor M13A is electrically coupled to the first signal output terminal OUT1. The first output pull-down subcircuit 21 is used to conduct the third level signal terminal VGL with the first signal output terminal OUT1 under the control of a valid signal at the first pull-down node PD_A.

In the second output pull-down subcircuit 22, a gate of the twenty-third transistor M13B is electrically coupled to the first pull-down node PD_A, a first electrode (source) of the twenty-third transistor M13B is electrically coupled to the third level signal terminal VGL, a second electrode (drain) of the twenty-third transistor M13B is electrically coupled to the second signal output terminal OUT2, and the second output pull-down subcircuit 22 is used to conduct the third level signal terminal VGL with the second signal output terminal OUT2 under the control of a valid signal at the first pull-down node PD_A.

The shift register further includes a second pull-down node PD_B.

In the second pull-down control subcircuit 32, a gate of the sixtieth transistor M6B is electrically coupled with the pull-up node PU. A source of the sixtieth transistor M6B is electrically coupled to the first level signal terminal LVGL. A drain of the fiftieth transistor M5B is electrically coupled to the fourth level signal terminal VDD2. A source of the fiftieth transistor M5B is electrically coupled to the second pull-down node PD_B for providing a valid signal to the second pull-down node PD_B based on the valid signal at the fourth level signal terminal VDD2.

The second pull-down control subcircuit 32 of the embodiment controls the first output pull-down subcircuit 21 and the second output pull-down subcircuit 22 in a second time during the pull-down stage, and clamps the first signal output terminal OUT1 and the second signal output terminal OUT2 at the third level. The second pull-down control subcircuit 32 together with the first pull-down control subcircuit 31 make an alternate control on the first output pull-down subcircuit 21 and the second output pull-down subcircuit 22, and clamp the first signal output terminal OUT1 and the second signal output terminal OUT2 at the third level. The second pull-down control subcircuit 32 shares the control load of the first pull-down control subcircuit 31 and prolongs the service life of the first pull-down control subcircuit 31 and the second pull-down control subcircuit 32.

The shift register of the embodiment further includes a register pull-down subcircuit 71.

In the register pull-down subcircuit 71, a gate of the twelfth transistor M12A is electrically coupled to the first pull-down node PD_A. A gate of the twenty-second transistor M12B is electrically coupled to the second pull-down node PD_B. Both a source of the twelfth transistor M12A and a source of the twenty-second transistor M12B are electrically coupled to the first level signal terminal LVGL. A drain of the twelfth transistor M12A is electrically coupled to the shift signal output terminal Carry1. The register pull-down subcircuit 71 is used to conduct the first level signal terminal LVGL with the shift signal output terminal Carry1 under the control of a valid signal at the first pull-down node PD_A or the second pull-down node PD_B.

The register pull-down subcircuit 71 of the present disclosure clamps a signal output by the shift signal output terminal Carry1 at the first level under the control of a valid signal at the first pull-down node PD_A or the second pull-down node PD_B, reducing interference to the back-end circuit of the shift signal output terminal.

FIG. 3 is a schematic view of the circuit structure of the shift register of the embodiment, and particularly the first reset subcircuit 51 and the second reset subcircuit 52, shown in FIG. 2, are illustrated in FIG. 3. A gate of the second transistor M2 of the first reset subcircuit 51 is electrically coupled to the first reset terminal RST, a source of the second transistor M2 is electrically coupled to the first level signal terminal LVGL, and a drain of the second transistor M2 is electrically coupled to the pull-up node PU. The first reset subcircuit 51 is used to conduct the first level signal terminal LVGL with the pull-up node PU under the control of a valid signal at the first reset terminal RST. A gate of the fifteenth transistor M15 of the second reset subcircuit 52 is electrically coupled to the second reset terminal TGOA_RST, a source of the fifteenth transistor M15 is electrically coupled to the first level signal terminal LVGL, and a drain of the fifteenth transistor M15 is electrically coupled to the pull-up node PU. The second reset subcircuit 52 is used to conduct the first level signal terminal LVGL with the pull-up node PU under the control of a valid signal at the second reset terminal TGOA_RST As shown in FIG. 3, the first pull-down control subcircuit 31 further includes a fourth transistor M4A, a seventh transistor M7A, and a ninth transistor M9A.

A gate of the fourth transistor M4A is electrically coupled to the pull-up node PU; a gate of the seventh transistor M7A is electrically coupled to the trigger signal input terminal INPUT; both a first electrode (source) of the fourth transistor M4A and a first electrode (source) of the seventh transistor M7A are electrically coupled to the first level signal terminal LVGL; a second electrode (drain) of the fourth transistor M4A and a second electrode (drain) of the seventh transistor M7A are electrically coupled to a gate of the fifth transistor M5A and the first pull-down node PD_A, respectively. A drain and a gate of the ninth transistor M9A are electrically coupled to the second level signal terminal VDD1, and a source of the ninth transistor M9 A is electrically coupled to the gate of the fifth transistor M5A.

The second pull-down control subcircuit 32 further includes the fortieth transistor M4B, the seventieth transistor M7B, and the ninetieth transistor M9B.

A gate of the fortieth transistor M4B is electrically coupled to the pull-up node PU; a gate of the seventieth transistor M7B is electrically coupled to the trigger signal input terminal INPUT; both a first electrode (source) of the fortieth transistor M4B and a first electrode (source) of the seventieth transistor M4B are electrically coupled to the first level signal terminal LVGL; a second electrode (drain) of the fortieth transistor M4B and a second electrode (drain) of the seventieth transistor M7B are electrically coupled to a gate of the fiftieth transistor M5B and the second pull-down node PD_B, respectively. A drain and a gate of the ninety transistor M9B are electrically coupled to the fourth level signal terminal VDD2, and a source of the ninety transistor M9B is electrically coupled to the gate of the fifty transistor M5B.

A gate, a first electrode (source) and a second electrode (drain) of the eighth transistor M8A are electrically coupled to the first pull-down node PD_A, the first level signal terminal LVGL and the pull-up node PU, respectively.

A gate, a first electrode (source) and a second electrode (drain) of the eighteenth transistor M8B are electrically coupled to the second pull-down node PD_B, the first level signal terminal LVGL, and the pull-up node PU, respectively.

As shown in FIG. 3, the first output pull-down subcircuit 21 includes a thirteenth transistor M13A and a fourteenth transistor M14A. The gate, the first electrode (source) and the second electrode (drain) of the thirteenth transistor M13 A are electrically coupled to the first pull node PD_A, the third level signal terminal VGL and the first signal output terminal OUT1, respectively. The gate, the first (source) and the second (drain) of the 14th transistor M14A are electrically coupled to the second pull-down node PD_B, the third level signal terminal VGL and the first signal output terminal OUT1, respectively.

The second output pull-down subcircuit 22 includes the twenty-third transistor M13B and the twenty-fourth transistor M14B. The gate, the first electrode (source) and the second electrode (drain) of the twenty-third transistor M13B are electrically coupled to the first pull-down node PD_A, the third level signal terminal VGL and the second signal output terminal OUT2, respectively. The gate, the first electrode (source) and the second electrode (drain) of the twenty-fourth transistor M14B are electrically coupled to the second pull-down node PD_B, the third level signal terminal VGL and the second signal output terminal OUT2, respectively.

The third output pull-down subcircuit 23 includes a thirty-third transistor M13C and a twenty-fourth transistor M14B. A gate, a first electrode (source) and a second electrode (drain) of the thirty-third transistor M13C are electrically coupled to the first pull-down node PD_A, the third level signal terminal VGL and the third signal output terminal OUT3, respectively. A gate, a first electrode (source) and a second electrode (drain) of the thirty-fourth transistor M14C are electrically coupled to the second pull-down node PD_B, the third level signal terminal VGL and the third signal output terminal OUT3, respectively.

In an embodiment, all transistors described herein may be P-type transistors (e.g., P-type thin film transistors), and in this case, a valid signal at a gate of each of the transistors may be a low level signal. Alternatively, all transistors described herein may be N-type transistors (e.g., N-type thin film transistors), and in this case, a valid signal at a gate of each of the transistors may be a high level signal. However, the present disclosure is not limited thereto. For example, all transistors described herein may be a combination of P-type transistors and N-type transistors.

The shift register described above solves the problem that a gate drive circuit with the shift register as a basic unit occupies a large area of an array substrate and cause the array substrate to have a wider frame (i.e., border), and thus can achieve the effect of narrowing down the frame.

The shift register of the present disclosure can accommodate more output subcircuits and enable the more output subcircuits to share the input subcircuit 11, the first pull-down control subcircuit 31, the second pull-down control subcircuit 32, the first reset subcircuit 51, the second reset subcircuit 52 and the like, thus further reducing the devices of the overall circuit and further reducing the area occupied by the circuit.

However, it was found by the inventors that, there was a time interval between rising edges of two different clock signals CLK (for example, clock signals CLK1 to CLK3) with a normal-CLK driving method, although the clock signals CLK thereof have the same period, and high and low levels thereof have the same pulse width. This will lead to the fact that characteristics of transistors in different output subcircuits have greater difference therebetween as the driving time elongates, and eventually lead to greater difference in the brightness of R, G, B pixels. In order to overcome this defect, in the present disclosure, clock signals at the first clock terminal CLK1, the second clock terminal CLK2 and the third clock terminal CLK3 may be defined to be valid signals, rising edges of which are synchronized with each other, so that the transistors in the first output subcircuit 12, the second output subcircuit 13 and the third output subcircuit 14 are simultaneously turned on, thus greatly eliminating the difference between the voltage rise times tr of the transistors, and avoiding the above defect and ensuring that the electrical characteristics of the transistors in the first to third output subcircuits 12, 13 and 14 are attenuated almost synchronously so that the brightness difference between pixels is controlled within an allowable range.

Figure 4:
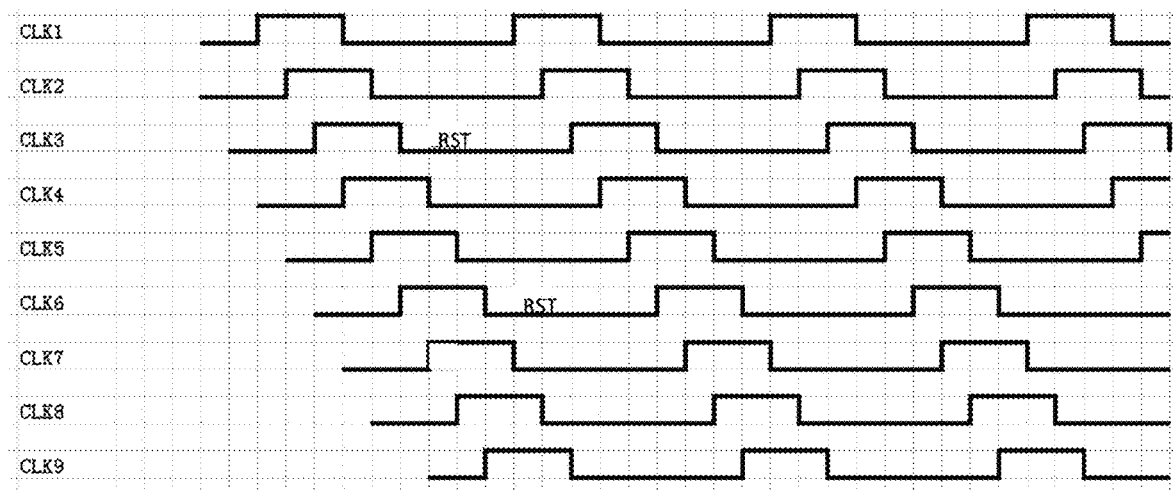
FIG. 4 is a timing diagram illustrating conventional clock signals for driving a shift register according to an embodiment of the present disclosure.

FIG. 4 is a timing diagram illustrating conventional clock signals for driving a shift register according to an embodiment of the present disclosure.

Referring to FIG. 4, it can be seen that, the clock signals CLK used in the Normal-CLK driving method have the same period, and the same high and low level pulse widths. FIG. 4 shows a plurality of sets of pulse signals CLK1-CLK9 at different times. In this driving method, for example, the clock signals CLK1 to CLK3 will cause different rising times tr of the voltages at the first to third signal output terminals OUT1, OUT2 and OUT3, and stress on the respective transistors may be also different. Throughout the driving process, the most important factor on stress of the three output terminals is a voltage rise stage, i.e. tr stage, during which a high voltage and a large current are generated. A long-time driving will cause the characteristics difference between the third transistor M3A, the thirtieth transistor M3B, and the thirty-first transistor M3C for outputting to become greater, eventually leading to the larger brightness difference between the three kinds of pixels R, G, B.

Figure 5:
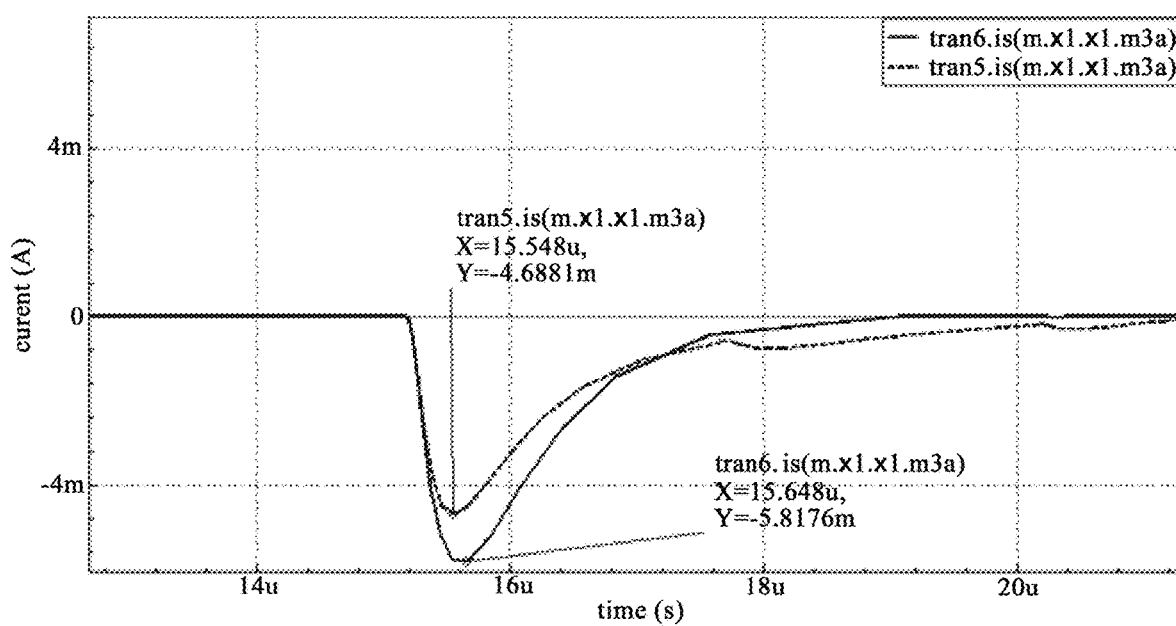
FIG. 5 is a schematic view illustrating current stress (i.e., electrical current load states) at an output terminal of a shift register driven by conventional clock signals and D-CLK clock signals according to an embodiment of the present disclosure.

FIG. 5 is a schematic view illustrating current stress at an output terminal of a shift register driven by Normal CLK clock signals and D-CLK clock signals according to an embodiment of the present disclosure. The stage shown in FIG. 5 is an output stage of the third transistor M3A, for example, and the horizontal axis represents time and the vertical axis represents current. The solid curve similar to a parabola with a valley at the bottom represents the current stress curve of the shift register driven by the Normal CLK clock signals, and the dotted curve similar to a parabola with a valley at the top represents the current stress curve of the shift register driven by the D-CLK clock signals. When the clock signals of the same period and with the same high and low level pulse widths (but there is a time interval between the rising edges of the high level of the different clock signals) are applied to the shift register as driving signals, as the clock signal rises, the current is larger, the gate voltage is higher, and the stress on the transistor M3A is largest. As shown in FIG. 5, the current driven by the Normal CLK clock signals is larger than that driven by the D-CLK clock signals and has a longer duration.

To reduce the difference in stress on transistors between different rows of sub-pixels, the present disclosure provides a driving method of a shift register based on the above shift register.

An embodiment of the present disclosure provides a driving method of a shift register in another aspect, including steps of: providing, by the input subcircuit 11, a valid signal to the pull-up node PU when the valid signal is received by the control terminal of the input subcircuit 11 from the trigger signal input terminal INPUT; conducting, by the first output subcircuit 12, the first clock terminal CLK1 electrically coupled to the first output subcircuit 12 with the first signal output terminal Output1 when the valid signal at the pull-up node PU is received by the control terminal of the first output subcircuit 12; and conducting, by the second output subcircuit 13, the second clock terminal CLK2 electrically coupled to the second output subcircuit 13 with the second signal output terminal Output2 when the valid signal at the pull-up node PU is received by the control terminal of the second output subcircuit 13.

In an embodiment, the driving method of the shift register provided by the present disclosure further includes a step of: providing, by the first pull-down control subcircuit 31 and the second pull-down control subcircuit 32, a valid signal to the first pull-down node PD_A and the second pull-down node PD_B, respectively, when the valid signal is alternately output by the second level signal terminal VDD1 and the fourth level signal terminal VDD2 such that the first output pull-down subcircuit 21, under the control of the valid signal at the first pull-down node PD_A or the second pull-down node PD_B, conducts the third level signal terminal VGL with the first signal output terminal Output1, and the second output pull-down subcircuit 22, under the control of the valid signal at the first pull-down node PD_A or the second pull-down node PD_B, conducts the third level signal terminal VGL with the second signal output terminal Output2.

In an embodiment, the driving method of the shift register further includes a step of: when valid signals are received at both control terminals of the first output subcircuit 12 and the second output subcircuit 13, providing, by the first clock terminal CLK1 and the second clock terminal CLK2, valid signals having synchronous rising edges, to the input terminal of the first output subcircuit 12 and the input terminal of the second output terminal 13.

Figure 6:
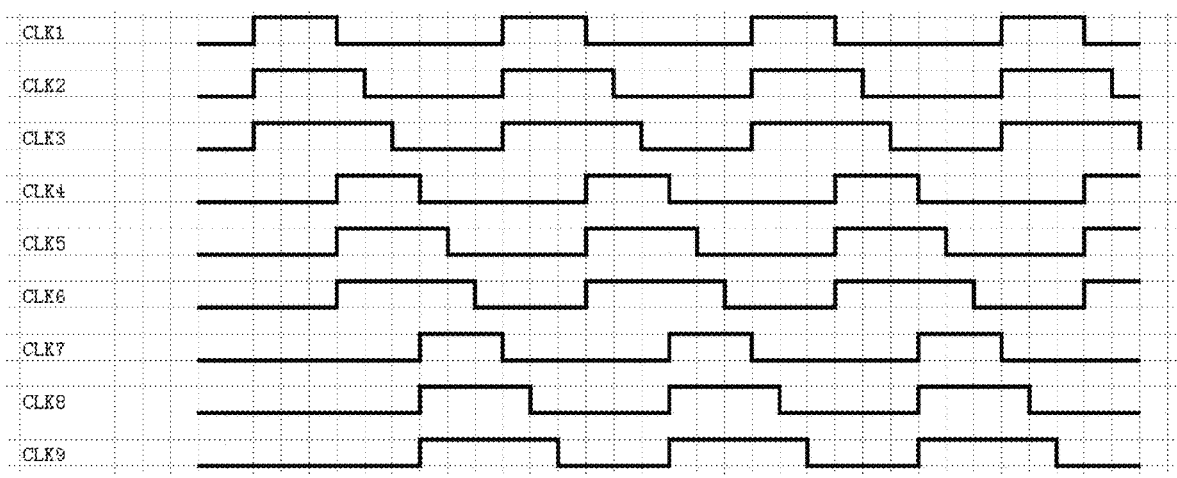
FIG. 6 is a timing diagram of D-CLK clock signals for driving a shift register according to an embodiment of the present disclosure.

FIG. 6 is a timing diagram of D-CLK clock signals for driving a shift register according to an embodiment of the present disclosure. FIG. 6 illustrates clock signals, as driving signals, having a same period and different high and low level pulse widths (different duty cycles) used in the so-called D-CLK driving process. Clock signals CLK1 to CLK9 represent pulse signals at different times, and this D-CLK driving procedure will cause substantially the same rising times tr of the respective voltages at the three signal output terminals Output1, Output2 and Output3, and reduce the stress difference among the respective transistors. Throughout the whole D-CLK driving process, the time required to generate the high voltage and the large current at the three signal output terminals Output1, Output2 and Output3 is reduced.

The clock signals at the first clock terminal CLK1 and the second clock terminal CLK2 are defined to be valid signals with the synchronous rising edges such that the transistors in the first output terminal 12 and the second output subcircuit 13 are simultaneously turned on and the difference between the rising times tr of the voltages of the transistors is greatly reduced, which will avoid the problem that a long-time driving will cause the characteristics difference between the transistors in the respective output subcircuits to become greater and greater and eventually lead to the larger brightness difference between the three kinds of pixels R, G, B, and ensures that the electrical characteristics of the transistors in the respective output subcircuits attenuate almost synchronously and the brightness difference between every two pixels is controlled to be in the allowable range.

Figure 7:
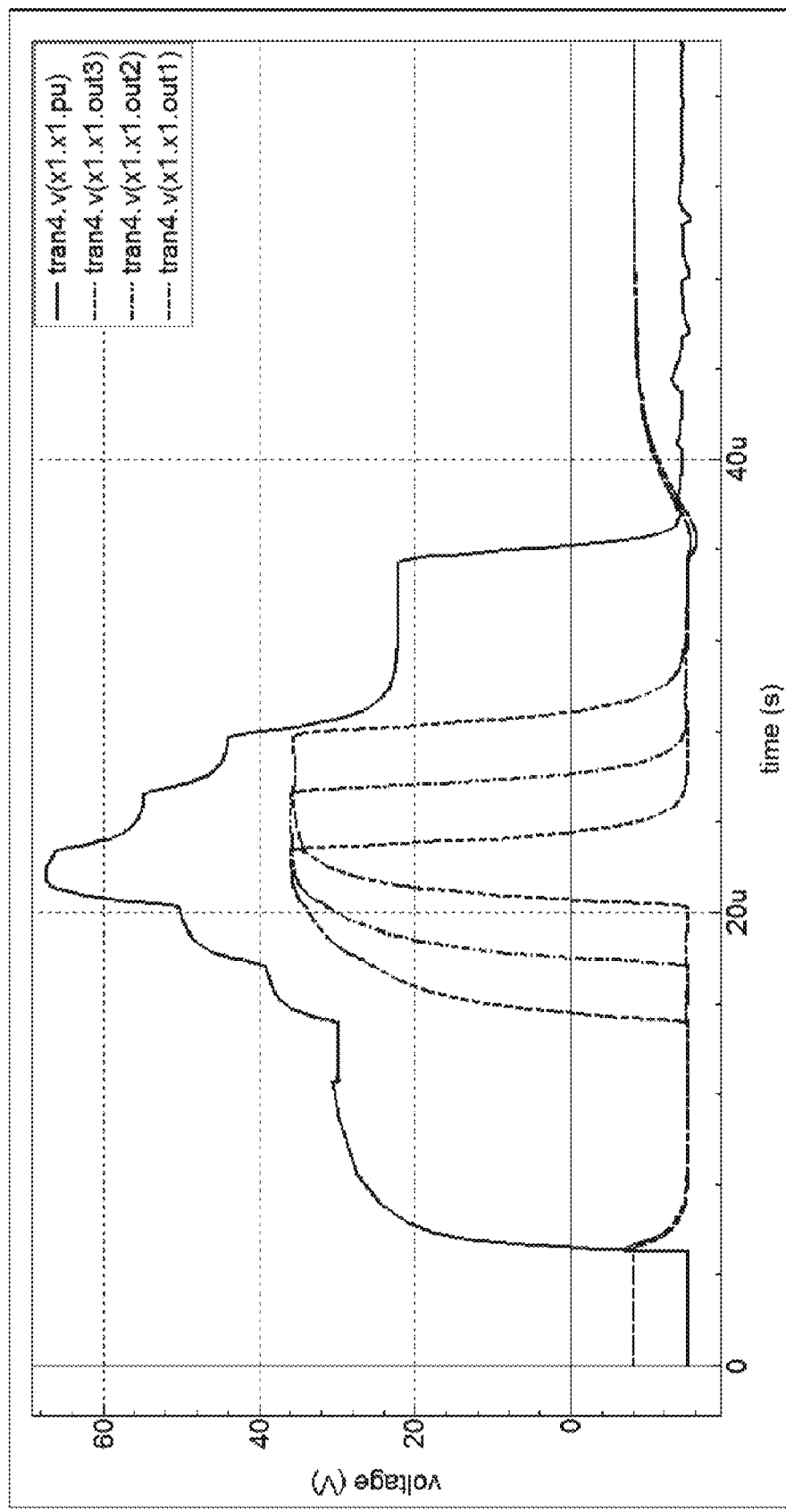
FIG. 7 is schematic view illustrating waveforms of signals at a pull-up node and various output terminals of the shift register driven by conventional clock signals according to an embodiment of the present disclosure.

FIG. 7 is schematic view illustrating waveforms of signals at a pull-up node and various output terminals of the shift register driven by normal-CLK clock signals according to an embodiment of the present disclosure. A horizontal axis in FIG. 7 represents time, and a vertical axis represents voltages (levels) at the pull-up node and the output terminals.

In FIG. 7, rising edges of valid signals of the normal-CLK clock signals CLK1 to CLK3 do not rise synchronously, but there is a phase difference between every two clock signals, causing the level at the pull-up node PU to rise step by step. The third transistor M3A in the first output subcircuit 12, the thirtieth transistor M3B in the second output subcircuit 13, and the thirty-first transistor M3C in the third output subcircuit 14 were successively changed from being turned off to being turned on under the control of the level rising step by step, resulting in the inconsistency of tr time among the three transistors. The third transistor M3A in the first output subcircuit 12 has the longest tr time, withstands the largest current load, is most prone to failure, any may have a shortest service life, thus shortening the service life of the overall shift register. For example, in a specific case shown in Table 1 below, the Tr times (i.e., tr times or times tr) of the third transistor M3A, the thirtieth transistor M3B, and the thirty-first transistor M3C corresponding to the first signal output terminal OUT1, the second signal output terminal OUT2, and the third signal output terminal OUT3 are 2508 ns, 843 ns, 496 ns, respectively. The Tr time of the third transistor M3A in the first output subcircuit 12 is much longer than those of the thirtieth transistor M3B in the second output subcircuit 13 and the thirty-first transistor M3C in the third output subcircuit 14, which makes the third transistor M3A in the first output subcircuit 12 prone to failure.

Figure 8:
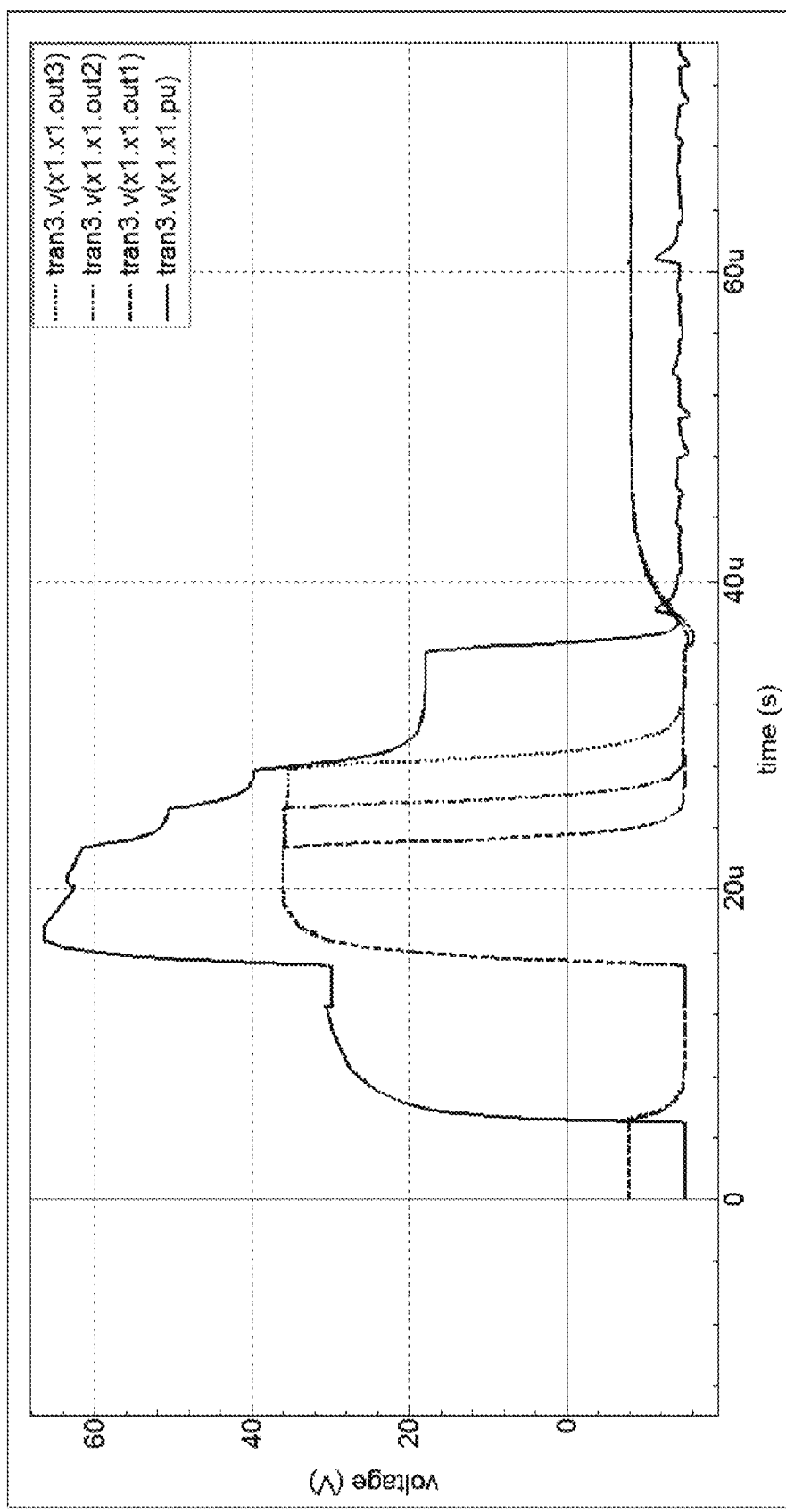
FIG. 8 is schematic view illustrating waveforms of signals at a pull-up node and various output terminals of the shift register driven by D-CLK clock signals according to an embodiment of the present disclosure.

FIG. 8 is schematic view illustrating waveforms of signals at a pull-up node and various output terminals of the shift register driven by D-CLK clock signals according to an embodiment of the present disclosure. A horizontal axis in FIG. 8 represents time, and a vertical axis represents voltages (levels) at the pull-up node and the output terminals.

In FIG. 8, using the D-CLK clock signals provided by the present embodiment, the three clock signals CLK1 to CLK3 provide valid signals with a synchronous rising edge such that the level at the pull-up node PU immediately rises to a working level (valid level), resulting in the fact that the third transistor M3A in the first output subcircuit 12, the thirtieth transistor M3B in the second output subcircuit 13 and the thirty-first transistor M3C in the third output subcircuit 14 synchronously changed from being turned off to being turned on under the control of the immediately rising valid level. Thus, the Tr times of the third transistor M3A, the thirtieth transistor M3B and the thirty-first transistor M3C are consistent with each other, and the Tr times of the third transistor M3A and the thirtieth transistor M3B are greatly shortened, which can prevent failure due to the excessively long Tr times of the third transistor M3A in the first output subcircuit 12 and the thirtieth transistor M3B in the second output subcircuit 13 from occurring, and is beneficial to prolong the service life of the third transistor M3A and the thirtieth transistor M3B. For example, in Table 2 below, under the control of the D-CLK clock signals of the present embodiment, the Tr times of the third transistor M3A, the thirtieth transistor M3B, and the thirty-first transistor M3C corresponding to the first signal output terminal Output1, the second signal output terminal Output2, and the third signal output terminal Output3 are 559 ns, 559 ns, 559 ns, respectively.

Table 1 is an example of rising times (tr or Tr) and falling times (tf or Tf) under two different driving timings of the present embodiments.

|  | Normal CLK | | D-CLK | |
|---|---|---|---|---|
|  | Tr(ns) | Tf(ns) | Tr(ns) | Tf(ns) |
| OUT1 | 2508 | 166 | 559 | 60 |
| OUT2 | 843 | 212 | 559 | 99 |
| OUT3 | 496 | 347 | 559 | 238 |

Table 2 is an example of a GOA region width of the embodiment of the present disclosure.

|  | GOA region width (frame width) |
|---|---|
| Triple gate Normal CLK | 5 mm |
| Triple gate D-CLK | 2.5 mm |

An embodiment of the present disclosure provides a gate drive circuit including the shift register described above.

In an embodiment, the gate drive circuit of the embodiment includes a plurality of shift registers. In the gate drive circuit of the present disclosure, the trigger signal input terminal of the $n^{th}$ shift register is coupled to the shift signal output terminal of the $(n-1)^{th}$ shift register, the first reset terminal of the $n^{th}$ shift register is coupled to the shift signal output terminal of the $(n+2)^{th}$ shift register, and n is a natural number greater than 1.

Figure 9:
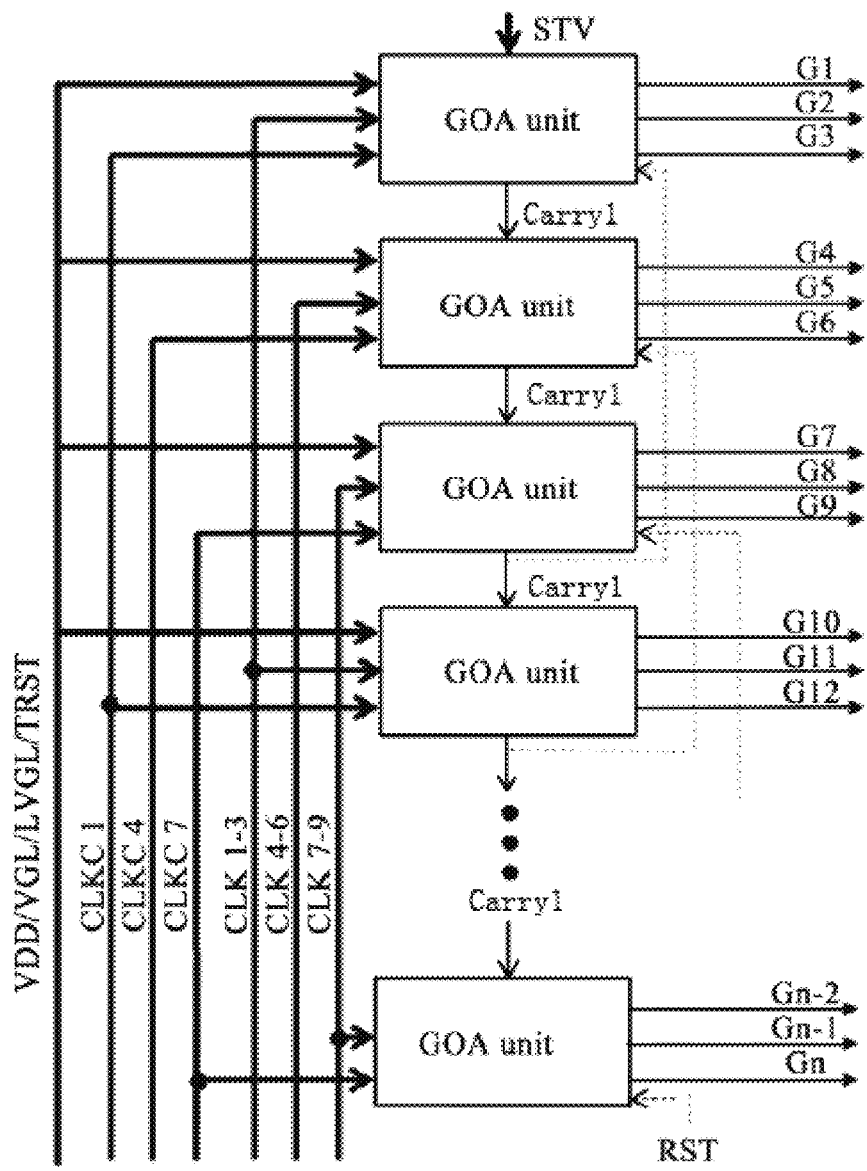
FIG. 9 is a schematic view illustrating a cascaded circuit of a plurality of shift registers.

FIG. 9 is a schematic view illustrating a cascaded circuit (which is a gate driving circuit) of a plurality of shift registers.

In particular, in FIG. 9, each GOA unit receives electrical signals at signal terminals VDD (including the second level signal terminal VDD1 and the fourth level signal terminal VDD2), the third level signal terminal VGL, the first level signal terminal LVGL, and the second reset terminal TGOA_RST; the GOA units in the first to third rows receive shift clock signals CLKC1, CLKC4, CLKC7, respectively; the GOA units in the first to third rows receive the clock signal groups CLK1-3 (i.e., CLK1 to CLK3), CLK4-6 (i.e., CLK4 to CLK6) and CLK7-9 (i.e., CLK7 to CLK9), respectively; the GOA unit in the first row, which also has a vertical start signal input terminal STV coupled thereto for proving a start trigger signal thereto, outputs the driving signals by its output terminals G1 to G3 (i.e. Output1 to Output3), and outputs the shift signal by the shift signal output terminal Carry1 as the trigger signal (i.e., trigger input signal) of the GOA unit in the next row so that the trigger signal and the drive signal are separated from each other, which will mitigate related circuit and device load associated with the output terminal G3 (i.e. Output3), prolong the service life of the circuit and device, and reduce the interference to the driving signal. In addition, the shift signal output terminal Carry1 of the GOA unit in the $(n+2)^{th}$ row is electrically coupled to the reset terminal RST of the GOA unit in the $n^{th}$ row, and the shift signal output by the shift signal output terminal Carry1 of the GOA unit in the $(n+2)^{th}$ row is also used as the reset signal of the GOA unit in the $n^{th}$ row.

In another aspect, an embodiment of the present disclosure provides a display apparatus including the gate drive circuit described above.

A working principle of the shift register of the embodiment is described below.

Figure 10:
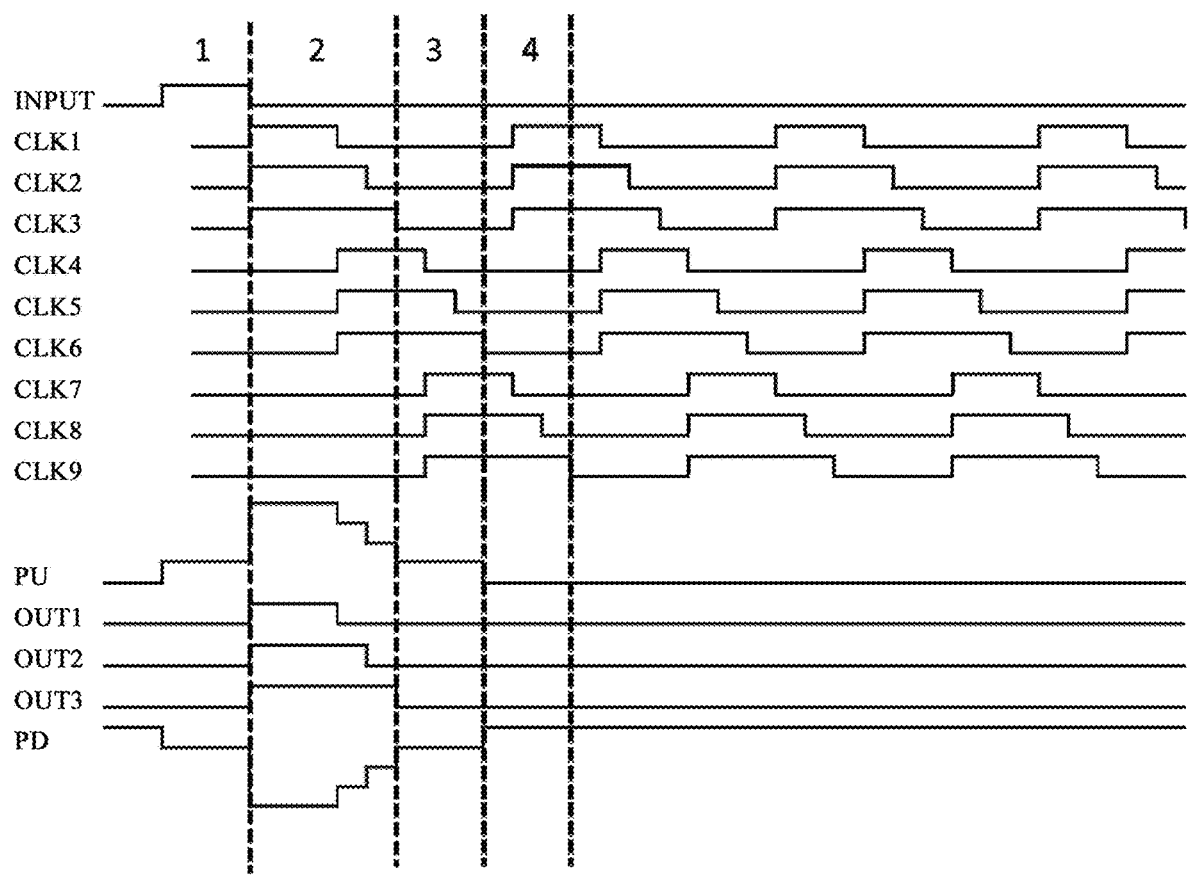
FIG. 10 is a timing diagram illustrating signals at various output terminals of a shift register driven by D-CLK clock signals according to an embodiment of the present disclosure.

FIG. 10 is a timing diagram illustrating signals at various output terminals of a shift register driven by D-CLK clock signals according to an embodiment of the present disclosure.

In particular, as shown in FIG. 10, by taking a case where all of the transistors as described above are N-type transistors as an example, the working procedure of the shift register according to the embodiment of the present disclosure includes the following stages, a first stage 1 to a fourth stage 4.

At the first stage 1 (i.e. charging stage), a high level is output by the shift signal output terminal Carry1 of the shift register in the (n−1)$^{th}$ row, the high level is input to the gate of the first transistor M1 by the trigger signal input terminal INPUT of the shift register in the n$^{th}$ row, and output by the source of the first transistor M1, which causes the pull-up node PU to rise to be at a valid level. On one hand, the rising potential at the pull-up node PU makes the third transistor M3A, the thirtieth transistor M3B and the thirty-first transistor M3C be turned on, making the first clock signal terminal CLK1, the second clock signal terminal CLK2 and the third clock signal terminal CLK3 conduct with the first signal output terminal Output1, the second signal output terminal Output2 and the third signal output terminal Output3, respectively. At this time, since the first clock signal terminal CLK1, the second clock signal terminal CLK2, the third clock signal terminal CLK3 are all at the low level, so the third transistor M3A, the thirtieth transistor M3B and the thirty-first transistor M3C output a low level (invalid signal) at their sources. Further, the eleventh transistor M11 is turned on, and the shift clock signal terminal CLKC conducts with the shift signal output terminal Carry1.

On the other hand, the sixth transistor M6A and the sixtieth transistor M6B are turned on, so that the level at the first pull-down node PD_A coupled to the drain of the sixth transistor M6A is pulled down by the first level signal terminal LVGL coupled to the source of the sixth transistor M6A, and the twelfth transistor M12A, the thirteenth transistor M13A, the twenty-third transistor M13B, and the thirty-third transistor M13C controlled by the first pull-down node PD_A all remain turned off. Furthermore, the level at the second pull-down node PD_B coupled to the drain of the sixtieth transistor M6B is pulled down by the first level signal terminal LVGL coupled to the source of the sixtieth transistor M6B, resulting in the fact that the twenty-second transistor M12B, the fourteenth transistor M14A, the twenty-fourth transistor M14B and the thirty-fourth transistor M14C controlled by the second pull-down node PD_B all remain turned off.

Furthermore, the trigger signal input terminal INPUT also inputs the high level to the gates of the seventh transistor M7A and the seventieth transistor M7B, thus making the seventh transistor M7A and the seventieth transistor M7B be changed to be turned on from being turned off, and pulling levels at the first pull-down node PD_A and the second pull-down node PD_B down to the low level by the first level signal input terminal LVGL, respectively.

When the first pull-down node PD_A is at the low level, the eighth transistor M8A remains turned off under the control of the low level at the first pull-down node PD_A; when the second pull-down node PD_B is at the low level, the eightieth transistor M8B remains turned off under the control of the low level at the second pull-down node PD_B.

At the second stage 2, the clock signals at the first to third clock signal terminals CLK1 to CLK3 are synchronously changed to be at the high level at the beginning of the second stage 2, last for some time, and then are successively changed to be at the low level with a phase delay between every two adjacent clock signal terminals. That is, at the second stage 2, the clock signals at the first to third clock signal terminals CLK1 to CLK3 have the synchronous rising edges and have asynchronous falling edges with a delay phase between every two adjacent clock signal terminals. The trigger signal input terminal INPUT is at the low level, the third transistor M3A, the thirtieth transistor M3B, and the thirty-first transistor M3C synchronously output a high level at their respective sources based on the clock signals at the high level of the synchronous rising edges at the first to second clock signal terminals CLK1 to CLK3; this high level at the pull-up node PU may be further boosted up by the effects of the coupling capacitors C1, C2 and C3 shown in FIG. 3; the third transistor M3A, the thirtieth transistor M3B, and then the thirty-first transistor M3C are successively changed from being turned on to being turned off based on the respective falling edges with phases successively delayed for the three clock signal terminals CLK1 to CLK3, and accordingly the level at the pull-up node PU was successively reduced (but may still be at a high level).

For example, as shown in FIG. 6, the rising edges of the pulse signals at the first clock signal terminal CLK1, the second clock signal terminal CLK2, and the third clock signal terminal CKL3 are synchronized, and the falling edges for the respective pulse signals are delayed successively. In this example, the periods of the clock signal at the first clock signal terminal CLK1, the clock signal at the second clock signal terminal CLK2, and the clock signal at the third clock signal terminal CKL3 are the same, for example, 9H (H is a sub-period), the falling edge of the pulse signal at the second clock signal terminal CKL2 is 1H later than the falling edge of the pulse signal at the first clock signal terminal CKL1, and the falling edge of the pulse signal at the third clock signal terminal CK3 is 1H later than the falling edge of the pulse signal at the second pulse signal CKL2. That is to say, the time interval between the falling edges of the pulse signals at every two adjacent clock signal terminals is 1H. For example, 1H can be 7 ms to 8 ms.

As shown in FIG. 6, the duty cycle of the pulse signal at the first clock signal terminal CLK1 is 3/9, the duty cycle of the pulse signal at the second clock signal terminal CLK2 is 4/9, and the duty cycle of the pulse signal at the third clock signal terminal CKL3 is 5/9. The pulse signals at the three clock signal terminals CLK1 to CLK3 correspond to the clock signals for the three output subcircuits 12, 13 and 14 in a shift register GOA (also referred to as a GOA unit in FIG. 9). Similarly, the clock signals for the three output subcircuits in the second shift register GOA are similar to those in the first shift register GOA, but the rising edges of the pulse signals in the second shift register are respectively 3H later than those in the first shift register GOA; and the rising edges of the pulse signals for the third shift register GOA are respectively 3H later than those in the second shift register GOA, and so on.

The eleventh transistor M11 is turned on when the pull-up node PU is at the high level, and the high level (valid signal) is output from the shift signal output terminal Carry1 coupled to the source of the eleventh transistor M11 based on the high level at the shift clock signal terminal CLKC electrically coupled to the drain of the eleventh transistor M11.

At the third stage 3, the pulse signals at the first to third clock signal terminals CLK1 to CLK3 have been reversed to a low level, the level at the pull-up node PU is reduced (but still at a high level), and since the third transistor M3A, the thirtieth transistor M3B, the thirty-first transistor M3C are still turned on, levels at the respective sources of the third transistor M3A, the thirtieth transistor M3B, the thirty-first transistor M3C are lowered to a low level along with the pulse signals at the first to third clock signal terminals CLK1 to CLK3.

At the fourth stage 4 (i.e. a pull-down stage), the shift signal output terminal Carry1 of the shift register in the (N+2)$^{th}$ row outputs a high-level signal, the first reset signal terminal Rst (also referred to as RST) in the n$^{th}$ row is thus at the high level, and the gate of the second transistor M2 in the first reset subcircuit receives the high-level signal from the first reset signal terminal Rst, which makes the second transistor M2 be turned on, and since the source of the second transistor M2 is electrically coupled to the first level signal terminal LVGL, the voltage at the pull-up node PU is pulled down to a low level. The third transistor M3A, the thirtieth transistor M3B, the thirty-first transistor M3C, and the eleventh transistor M11 are changed to be turned off from being turned on under the control of the low-level signal at the pull-up node PU, so that the signals at the first to third signal output terminals Output1 to Output3 and the shift signal output terminal Carry1 are respectively irrelevant with those at the first to third clock signal terminals CLK1 to CLK3 and the shift clock signal terminal CLKC.

When the pull-up node PU is changed to be at the low level, the sixth transistor M6A is changed to be turned off, the level at the first pull-down node PD_A is no longer clamped by the first level signal terminal LVGL; the sixtieth transistor M6B is changed to be turned off, and the level at the second pull-down node PD_B is no longer clamped by the first level signal terminal LVGL.

When the pull-up node PU is changed to be at the low level, the fourth transistor M4A and the fortieth transistor M4B are changed to be turned off, and the level of the gates of the fifth transistor M5A and the fiftieth transistor M5B respectively electrically coupled to the drains of the fourth transistor M4A and the fortieth transistor M4B are no longer clamped by the first level signal terminal LVGL. The source of the fifth transistor M5A is electrically coupled to the first pull-down node PD_A, the source of the fiftieth transistor M5B is electrically coupled to the second pull-down node PD_B, and the fifth transistor M5A and the fiftieth transistor M5B are respectively turned on when the second level signal terminal VDD1 and the fourth level signal terminal VDD2 are changed to be at the high level, pulling a level at the first pull-up node PD_A and the second pull-down node PD_B up to the high level. When the second level signal terminal VDD1 and the fourth level signal terminal VDD2 alternately output the high-level signal, the level at the first pull-down node PD_A and the second pull-down node PD_B are alternately pulled up to the high level.

When the first pull-down node PD_A is at the high level, since the sources of the twelfth transistor M12A, the thirteenth transistor M13A, the twenty-third transistor M13B and the thirty-third transistor M13C are all electrically coupled to the third level signal terminal VGL, the twelfth transistor M12A, the thirteenth transistor M13A, the twenty-third transistor M13B and the thirty-third transistor M13C are all controlled to be turned on so that the shift signal output terminal Carry1 and the first to third signal output terminals Output1, Output 2 and Output 3 are clamped at the low level at the third level signal terminal VGL.

The signals output by the respective output subcircuits, for example the first output subcircuits 12 to 14, become to be at the invalid level, which prevents the respective output subcircuits from outputting noise signals, realizes the purpose of denoising the pull-up node PU and the respective output signal terminals, and prevents interference to other circuits. Further, the eighth transistor M8A is changed to being turned on under the control of the high-level signal at the first pull-down node PD_A, and a level at the pull-up node PU is clamped at the low level of the first level signal terminal LVGL.

When the second pull-down node PD_B is at a high level, since the sources of the twenty-second transistor M12B, the fourteenth transistor M14A, the twenty-fourth transistor M14B and the thirty-fourth transistor M14C are all coupled to the third level signal terminal VGL, and the twenty-second transistor M12B, the fourteenth transistor M14A, the twenty-fourth transistor M14B and the thirty-fourth transistor M14C are controlled to be turned on, and the shift signal output terminal Carry1, the first to third signal output terminals Output1, Output 2 and Output3 are clamped at the low level of the second level signal terminal VGL. Further, the eightieth transistor M8B is turned on under the control of the high level at the second pull-down node PD_B, and the pull-up node PU is clamped at the low level at the first level signal terminal LVGL.

The above four stages are executed sequentially to complete a period of operations for the n$^{th}$ shift register.

It should be understood that, the above embodiments are only exemplary embodiments for the purpose of explaining the principle of the present disclosure, and the present disclosure is not limited thereto. For one of ordinary skill in the art, various improvements and modifications may be made without departing from the spirit and essence of the present disclosure. These improvements and modifications also fall within the protection scope of the present disclosure.

What is claimed is:

1. A driving method of a shift register, wherein the shift register comprises an input subcircuit, a first output subcircuit, a second output subcircuit, a trigger signal input terminal, a first row scanning signal output terminal, a second row scanning signal output terminal, a first clock terminal, a second clock terminal and a pull-up node, wherein
   a control terminal and an output terminal of the input subcircuit are electrically coupled to the trigger signal input terminal and the pull-up node, respectively, for providing a valid signal received by the control terminal of the input subcircuit to the pull-up node;
   a control terminal, an input terminal and an output terminal of the first output subcircuit are electrically coupled to the pull-up node, the first clock terminal and the first row scanning signal output terminal, respectively, for providing a signal at the first clock terminal to the first row scanning signal output terminal under the control of the valid signal at the pull-up node; and
   a control terminal, an input terminal and the output terminal of the second output subcircuit are electrically coupled to the pull-up node, the second clock terminal and the second row scanning signal output terminal, respectively, for providing a signal at the second clock terminal to the second row scanning signal output terminal under the control of the valid signal at the pull-up node;
   wherein the shift register further comprises a first pull-down control subcircuit, a first output pull-down subcircuit, a second output pull-down subcircuit and a first pull-down node, wherein
   a first control terminal, a first input terminal, a second input terminal and an output terminal of the first pull-down control subcircuit are electrically coupled to the pull-up node, a first level signal terminal, a second level signal terminal and the first pull-down node, respectively, for providing a valid signal at the second level signal terminal to the first pull-down node;

a first control terminal, an input terminal and an output terminal of the first output pull-down subcircuit are electrically coupled to the first pull-down node, a third level signal terminal and the first row scanning signal output terminal, respectively, for providing a signal at the third level signal terminal to the first row scanning signal output terminal under the control of the valid signal at the first pull-down node; and a first control terminal, an input terminal and an output terminal of the second output pull-down subcircuit are electrically coupled to the first pull-down node, the third level signal terminal and the second row scanning signal output terminal, respectively, for providing a signal at the third level signal terminal to the second row scanning signal output terminal under the control of the valid signal at the first pull-down node, wherein the shift register further comprises a second pull-down control subcircuit and a second pull-down node, wherein a first control terminal, a first input terminal, a second input terminal and an output terminal of the second pull-down control subcircuit are electrically coupled to the pull-up node, the first level signal terminal, a fourth level signal terminal and the second pull-down node, respectively, for providing a valid signal at the fourth level signal terminal to the second pull-down node, wherein the driving method comprises:

providing, by the first pull-down control subcircuit and the second pull-down control subcircuit, valid signals to the first pull-down node and the second pull-down node, respectively, when the valid signals are alternately output at the second level signal terminal and the fourth level signal terminal, such that the first output pull-down subcircuit provides a signal at the third level signal terminal to the first row scanning signal output terminal under the control of the valid signal at the first pull-down node or the second pull-down node, and the second output pull-down subcircuit provides a signal at the third level signal terminal to the second row scanning signal output terminal under the control of the valid signal at the first pull-down node or the second pull-down node; and providing, by the first clock terminal and the second clock terminal, a first pulse signal and a second pulse signal with synchronous rising edges to the input terminal of the first output subcircuit and the input terminal of the second output subcircuit when valid signals are received by the control terminal of the first output subcircuit and the control terminal of the second output subcircuit.

2. The driving method of claim 1, wherein a falling edge of the second pulse signal is delayed relative to a falling edge of the first pulse signal by a phase delay.

3. The driving method of claim 1, wherein the first pull-down control subcircuit further comprises a second control terminal, which is electrically coupled to the trigger signal input terminal, and the first pull-down control subcircuit is configured to provide a signal at the first level signal terminal to the first pull-down node when a valid signal is received at the second control terminal.

4. The driving method of claim 3, wherein the shift register further comprises a first pull-up node pull-down subcircuit, wherein a control terminal, an input terminal and an output terminal of the first pull-up node pull-down subcircuit are electrically coupled to the first pull-down node, the first level signal terminal and the pull-up node, respectively, for providing a signal at the first level signal terminal to the pull-up node under the control of a signal at the first pull-down node.

5. The driving method of claim 4, wherein the second pull-down control subcircuit further comprises a second control terminal electrically coupled to the trigger signal input terminal, and the second pull-down control subcircuit is configured to provide a signal at the first level signal terminal to the second pull-down node when a valid signal is received by the second control terminal of the second pull-down control subcircuit.

6. The driving method of claim 5, wherein the shift register further comprises a second pull-up node pull-down subcircuit, wherein a control terminal, an input terminal and an output terminal of the second pull-up node pull-down subcircuit are electrically coupled to the second pull-down node, the first level signal terminal and the pull-up node, respectively, for providing a signal at the first level signal terminal to the pull-up node under the control of a signal at the second pull-down node.

7. The driving method of claim 6, wherein the shift register further comprises a first reset subcircuit and a first reset terminal, wherein a control terminal, an input terminal and an output terminal of the first reset subcircuit are electrically coupled to the first reset terminal, the first level signal terminal and the pull-up node, respectively, for providing a signal at the first level signal terminal to the pull-up node under the control of a valid signal at the first reset terminal.

8. The driving method of claim 7, wherein the shift register further comprises an output register subcircuit, a shift clock terminal and a shift signal output terminal, wherein a control terminal, an input terminal and an output terminal of the output register subcircuit are electrically coupled to the pull-up node, the shift clock terminal and the shift signal output terminal, respectively, for providing a signal at the shift clock terminal to the shift signal output terminal under the control of the valid signal at the pull-up node.

9. The driving method of claim 8, wherein the shift register further comprises a register pull-down subcircuit, wherein a first control terminal, a second control terminal, an input terminal and an output terminal of the register pull-down subcircuit are electrically coupled to the first pull-down node, the second pull-down node, the first level signal terminal and the shift signal output terminal, respectively, for providing a signal at the first level signal terminal to the shift signal output terminal under the control of a valid signal at the first pull-down node or the second pull-down node.

10. The driving method of claim 9, wherein the shift register further comprises a third output subcircuit to a $K^{th}$ output subcircuit, a third clock terminal to a $K^{th}$ clock terminal, a third row scanning signal output terminal to a $K^{th}$ row scanning signal output terminal, and a third output pull-down subcircuit to a $K^{th}$ output pull-down subcircuit; K is a natural number greater than or equal to 3, wherein all the third output subcircuit to the $K^{th}$ output subcircuit are electrically coupled to the pull-up node; and all the third output pull-down subcircuit to the K$^{th}$ output pull-down subcircuit are electrically coupled to both the first pull-down node and the second pull-down node.

11. The driving method of claim 10, wherein the first pull-down control subcircuit comprises a fourth transistor, a fifth transistor, a sixth transistor, a seventh transistor and a ninth transistor;
- a gate of the sixth transistor as the first control terminal of the first pull-down control subcircuit is electrically coupled to the pull-up node; a gate of the seventh transistor as the second control terminal of the first pull-down control subcircuit is electrically coupled to the trigger signal input terminal; first electrodes of the fourth transistor, the sixth transistor, and the seventh transistor as the first input terminal of the first pull-down control subcircuit are all electrically coupled to the first level signal terminal, and second electrodes of the sixth transistor and the seventh transistor are electrically coupled to the first pull-down node; and
- a second electrode of the fourth transistor, a gate of the fifth transistor and a first electrode of the ninth transistor are electrically coupled to each other; a second electrode of the fifth transistor and a second electrode of the ninth transistor as the second input terminal of the first pull-down control subcircuit are electrically coupled to each other; a first electrode of the fifth transistor is electrically coupled to the first pull-down node; and a gate and a first electrode of the fourth transistor are electrically coupled to the pull-up node and the first level signal terminal, respectively.

12. The driving method of claim 11, wherein the first output pull-down subcircuit comprises a thirteenth transistor and a fourteenth transistor;
- a gate, a first electrode and a second electrode of the thirteenth transistor are electrically coupled to the first pull-down node, the third level signal terminal and the first row scanning signal output terminal, respectively; and
- a gate, a first electrode and a second electrode of the fourteenth transistor are electrically coupled to the second pull-down node, the third level signal terminal and the first row scanning signal output terminal, respectively.

13. The driving method of claim 12, wherein the second pull-down control subcircuit comprises a fortieth transistor, a fiftieth transistor, a sixtieth transistor, a seventieth transistor and a ninetieth transistor;
- a gate of the sixtieth transistor as the first control terminal of the second pull-down control subcircuit is electrically coupled to the pull-up node; a gate of the seventieth transistor as the second control terminal of the second pull-down control subcircuit is electrically coupled to the trigger signal input terminal; first electrodes of the fortieth transistor, the sixtieth transistor, and the seventieth transistor each as the first input terminal of the second pull-down control subcircuit is electrically coupled to the first level signal terminal; and both second electrodes of the sixtieth transistor and the seventieth transistors are electrically coupled to the second pull-down node; and
- a second electrode of the fortieth transistor, a gate of the fiftieth transistor and a first electrode of the ninetieth transistor are electrically coupled to each other; a second electrode of the fiftieth transistor and a second electrode of the ninetieth transistor each as the second input terminal of the second pull-down control subcircuit are electrically coupled to each other; a first electrode of the fiftieth transistor is electrically coupled to the second pull-down node; and a gate the fortieth transistor is electrically coupled to the pull-up node.

14. The driving method of claim 1, wherein the shift register further comprises a third output subcircuit, a third clock terminal, a third row scanning signal output terminal and a third output pull-down subcircuit,
- a control terminal, an input terminal and an output terminal of the third output subcircuit are electrically coupled to the pull-up node, the third clock terminal and the third row scanning signal output terminal, respectively, for providing a signal at the third clock terminal to the third row scanning signal output terminal under the control of the valid signal at the pull-up node;
- a first control terminal, an input terminal and an output terminal of the third output pull-down subcircuit are electrically coupled to the first pull-down node, the third level signal terminal and the third row scanning signal output terminal, respectively, for providing a signal at the third level signal terminal to the third row scanning signal output terminal under the control of the valid signal at the first pull-down node;
- wherein the driving method further comprises: providing, by the third clock terminal, a third pulse signal to the input terminal of the third output subcircuit when a valid signal is received by the control terminal of the third output subcircuit, and
- wherein the first pulse signal, the second pulse signal and the third pulse signal have synchronous rising edges and have asynchronous falling edges with a delay phase between every two adjacent clock signal terminals.

15. The driving method of claim 1, wherein the delay phase between the falling edges of the pulse signals at every two adjacent clock signal terminals is 7 ms to 8 ms.

* * * * *